United States Patent
Masuoka et al.

(10) Patent No.: US 11,380,780 B2
(45) Date of Patent: Jul. 5, 2022

(54) METHOD FOR PRODUCING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Yoshiaki Kikuchi, Leuven (BE)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 47 days.

(21) Appl. No.: 16/992,352

(22) Filed: Aug. 13, 2020

(65) Prior Publication Data
US 2020/0373415 A1    Nov. 26, 2020

Related U.S. Application Data

(63) Continuation of application No. PCT/JP2018/017742, filed on May 8, 2018.

(51) Int. Cl.
*H01L 29/66* (2006.01)
*H01L 21/225* (2006.01)
(Continued)

(52) U.S. Cl.
CPC .. *H01L 29/66742* (2013.01); *H01L 21/02238* (2013.01); *H01L 21/02639* (2013.01);
(Continued)

(58) Field of Classification Search
CPC .................................. H01L 21/28531
See application file for complete search history.

(56) References Cited

U.S. PATENT DOCUMENTS 9,640,636 B1    5/2017  Bentley et al.
2016/0155842 A1  6/2016  Masuoka et al.
(Continued)

FOREIGN PATENT DOCUMENTS

| JP | H02-188966 A | 7/1990 |
| JP | 2001-320052 A | 11/2001 |
| WO | WO 2016/031014 A1 | 3/2016 |
| WO | WO 2018/033981 A1 | 2/2018 |

OTHER PUBLICATIONS

International Preliminary Report on Patentability, English translation, for Application No. PCT/JP2018/017742, dated Nov. 12, 2020, 5 pages.
(Continued)

*Primary Examiner* — Xiaoming Liu
(74) *Attorney, Agent, or Firm* — Crowell & Moring LLP

(57) ABSTRACT

A $SiO_2$ layer 5 is formed in the bottom portion of a Si pillar 3 and on an i-layer substrate 2. Subsequently, a gate $HfO_2$ layer 11b is formed so as to surround the side surface of the Si pillar 3, and a gate TiN layer 12b is formed so as to surround the $HfO_2$ layer 11b. Subsequently, $P^+$ layers 18 and 32 containing an acceptor impurity at a high concentration and serving as a source and a drain are simultaneously or separately formed by a selective epitaxial crystal growth method on the exposed side surface of the bottom portion of and on the top portion of the Si pillar 3. Thus, an SGT is formed on the i-layer substrate 2.

19 Claims, 34 Drawing Sheets

(51) Int. Cl.
  *H01L 21/308* (2006.01)
  *H01L 21/02* (2006.01)
  *H01L 21/306* (2006.01)
  *H01L 29/423* (2006.01)
  *H01L 29/786* (2006.01)

(52) U.S. Cl.
  CPC ........ *H01L 21/2252* (2013.01); *H01L 21/308* (2013.01); *H01L 21/30604* (2013.01); *H01L 29/42392* (2013.01); *H01L 29/66977* (2013.01); *H01L 29/78618* (2013.01); *H01L 29/78642* (2013.01); *H01L 29/78696* (2013.01)

(56) References Cited

U.S. PATENT DOCUMENTS

2018/0083121 A1* 3/2018 Suvarna ............ H01L 29/66666
2018/0248034 A1* 8/2018 Leobandung ....... H01L 29/4238

OTHER PUBLICATIONS

Takato et al., "Impact of Surrounding Gate Transistor (SGT) for Ultra-High-Density LSI's": IEEE Transaction on Electron Devices, vol. 38, No. 3, pp. 573-578 (1991).
Ting et al., "Study of Planarized Sputter-Deposited SiO2"J. Vac. Sci. Technol, 15 (3), pp. 1105-1112, May/Jun. (1978).
International Preliminary Report on Patentability for Application No. PCT/JP2018/017742, dated Nov. 19, 2019, including English translation of International Search Report for Application No. PCT/JP2018/017742, dated Jul. 31, 2018, 7 pages.

* cited by examiner

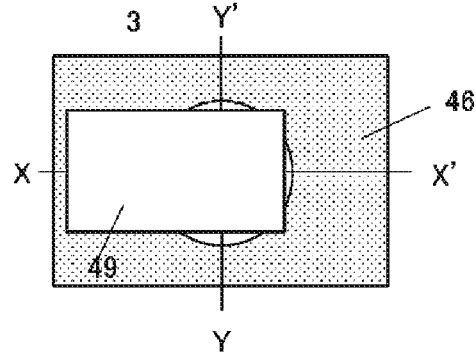
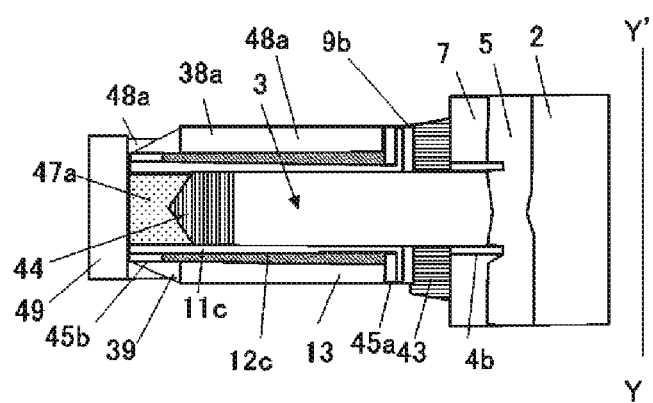
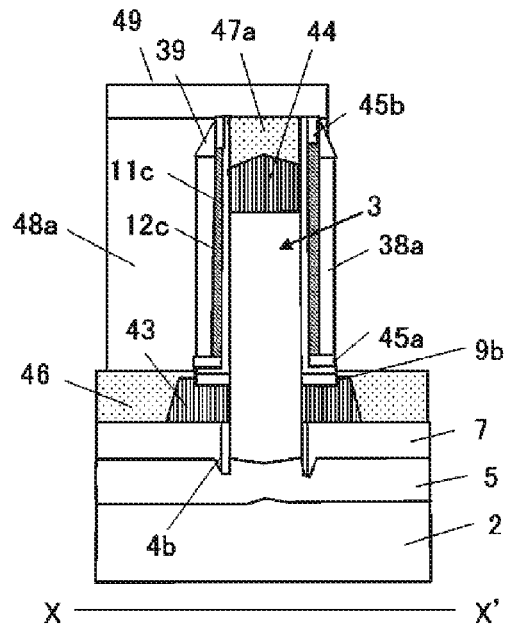

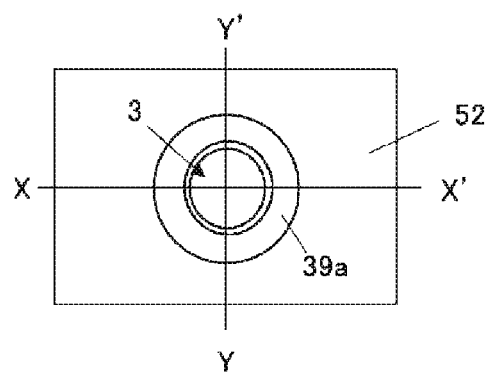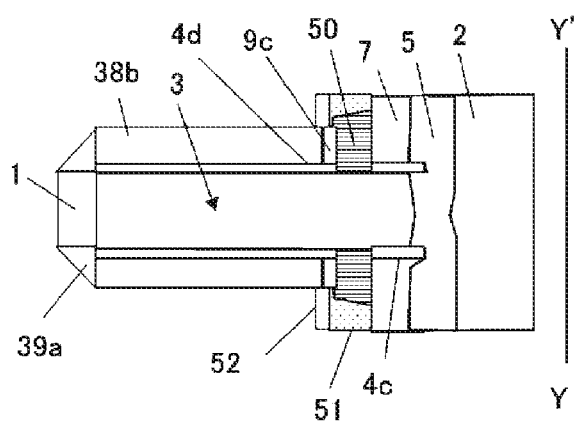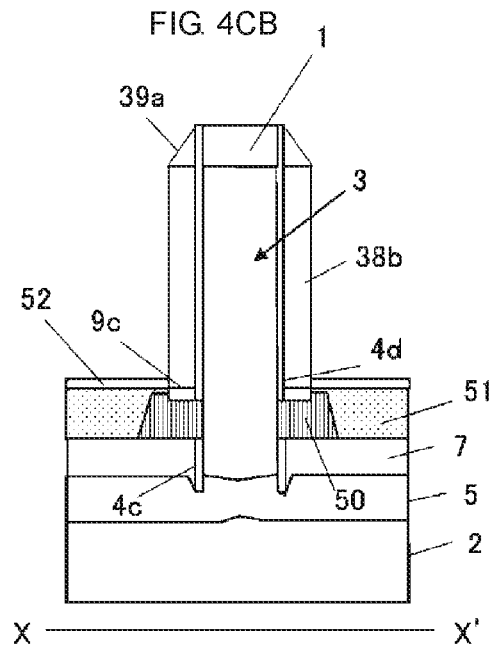

METHOD FOR PRODUCING PILLAR-SHAPED SEMICONDUCTOR DEVICE

CROSS REFERENCES TO RELATED APPLICATIONS

The present application is a continuation application of PCT/JP2018/017742, filed May 8, 2018. The contents of this application are incorporated herein by reference in its entirety.

BACKGROUND OF THE INVENTION

1. Field of the Invention

The present invention relates to a method for producing a pillar-shaped semiconductor device.

2. Description of the Related Art

In these years, three-dimensional transistors have been used in LSI (Large Scale Integration). In particular, surrounding gate transistors (SGTs), which are pillar-shaped semiconductor devices, have been attracting attention as semiconductor elements that provide highly integrated semiconductor devices. There has been a demand for an SGT-including semiconductor device that has a higher degree of integration and a higher performance.

Ordinary planar MOS transistors have a channel that extends in a horizontal direction along the upper surface of the semiconductor substrate. By contrast, SGTs have a channel that extends in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 5 is a schematic structural view of an N-channel SGT. A Si pillar 100 of a P or i (intrinsic) conductivity type (hereafter, silicon semiconductor pillars will be referred to as "Si pillars") has, in its upper and lower portions, $N^+$ layers 101a and 101b one of which functions as a source and the other one of which functions as a drain (hereafter, semiconductor regions containing a donor impurity at a high concentration will be referred to as "$N^+$ layers"). A portion of the Si pillar 100 between the $N^+$ layers 101a and 101b, which function as a source and a drain, functions as a channel region 102. Around this channel region 102, a gate insulating layer 103 is formed. Around this gate insulating layer 103, a gate conductor layer 104 is formed. In the SGT, the $N^+$ layers 101a and 101b functioning as the source and the drain, the channel region 102, the gate insulating layer 103, and the gate conductor layer 104 are formed so as to constitute a pillar. Thus, in plan view, the area occupied by the SGT corresponds to the area occupied by a single source-or-drain $N^+$ layer of a planar MOS transistor. Therefore, compared with a circuit chip including a planar MOS transistor, an SGT-including circuit chip enables a further reduction in the size of the chip.

In the SGT illustrated in FIG. 5, there has been a demand for a reduction in the resistance of $N^+$ layers 101a and 101b serving as the source and the drain. Such a reduction in the resistance of the $N^+$ layers 101a and 101b enables a decrease in the power consumption of and an increase in the speed of the SGT-including circuit. There has been a demand for a higher degree of integration of an SGT-including circuit.

SUMMARY OF THE INVENTION

There has been a demand for a pillar-shaped semiconductor device having a higher density, a lower power consumption, and a higher speed.

A method for producing a pillar-shaped semiconductor device according to a first aspect of the present invention includes:

a step of forming a semiconductor pillar so as to stand on and in a direction perpendicular to a substrate;

a step of forming a gate insulating layer so as to surround the semiconductor pillar;

a step of forming a gate conductor layer so as to surround the gate insulating layer;

a step of forming a first impurity region that is located lower than, in the perpendicular direction, the gate insulating layer, that is in contact with a lower portion of the semiconductor pillar or a side surface of the lower portion, and that contains a donor or acceptor impurity; and a step of forming a second impurity region that is located higher than, in the perpendicular direction, the gate insulating layer, that is located on a top portion of the semiconductor pillar, and that contains a donor or acceptor impurity, wherein the step of forming the second impurity region includes a step of forming a first material layer so as to surround an outer periphery of the top portion of the semiconductor pillar, a step of etching the top portion of the semiconductor pillar through the first material layer serving as a mask, and a step of forming a recessed portion formed by the etching and located above the semiconductor pillar, the method further including:

a step of forming a second material layer so as to surround an outer periphery of a side surface of the semiconductor pillar, the side surface being located lower than the gate insulating layer in the perpendicular direction; a step of etching the second material layer to form an opening portion in the side surface of the semiconductor pillar, the side surface being located lower than the gate insulating layer; and a step of simultaneously forming, in the recessed portion and the opening portion, the first impurity region and the second impurity region that contain donor or acceptor impurity atoms by a selective epitaxial crystal growth method.

More preferably, the second impurity region is formed so as to have an upper end located lower than the recessed portion.

More preferably, the method includes a step of forming a first conductor layer within the recessed portion so as to be in contact with an upper end of the second impurity region.

More preferably, the method includes:

a step of forming the semiconductor pillar by etching a semiconductor layer on the substrate through a mask material layer formed on the semiconductor layer and serving as a mask;

in the step of forming the first impurity region, a step of forming a third material layer on an entirety of a side surface of the semiconductor pillar; and a step of performing oxidation through the mask material layer and the third material layer that serve as anti-oxidation masks to form an oxidized layer in a bottom portion of the semiconductor pillar and in a surface layer of the semiconductor layer, the surface layer being located in an outer peripheral region around the semiconductor pillar.

More preferably, the first impurity region is formed so as to have, in the perpendicular direction, a lower end separated from an upper end of the oxidized layer in the bottom portion of the semiconductor pillar.

More preferably, the method includes:

a step of forming a fourth material layer so as to surround, in plan view, a side surface of a bottom portion of the semiconductor pillar;

a step of forming a fifth material layer so as to be located on the fourth material layer, to surround, with a constant width in plan view, the semiconductor pillar, and to be constituted by a single layer or a plurality of layers in the perpendicular direction;

a step of etching, in the perpendicular direction, the fourth material layer through the fifth material layer serving as a mask;

a step of etching, in a horizontal direction, the fourth material layer through the fifth material layer serving as a mask, to form the opening portion through which a side surface of a lower portion of the semiconductor pillar is exposed; and a step of forming, by a selective epitaxial crystal growth method, the first impurity region that extends, in plan view, outwardly from the side surface of the semiconductor pillar through the opening portion, and that contains a donor or acceptor impurity.

More preferably, the first impurity region is formed before the gate insulating layer is formed.

More preferably, the method includes:

a step of, after the first impurity region is formed, removing, with a constant width, an outer peripheral region around the semiconductor pillar, the outer peripheral region being located higher than, in the perpendicular direction, an upper end of the first impurity region; and a step of, after the removing step, forming the gate insulating layer.

More preferably, the method includes a step of, after the first impurity region and the second impurity region are formed, performing a heat treatment to diffuse a donor or acceptor impurity contained in the first impurity region into the semiconductor pillar to form a third impurity region and simultaneously to diffuse a donor or acceptor impurity contained in the second impurity region into the semiconductor pillar to form a fourth impurity region.

A method for producing a pillar-shaped semiconductor device according to a second aspect of the present invention includes:

a step of forming a semiconductor pillar so as to stand on and in a direction perpendicular to a substrate;

a step of forming a gate insulating layer so as to surround the semiconductor pillar;

a step of forming a gate conductor layer so as to surround the gate insulating layer;

a step of forming a first impurity region that is located lower than, in the perpendicular direction, the gate insulating layer, that is in contact with a lower portion of the semiconductor pillar or a side surface of the lower portion, and that contains a donor or acceptor impurity; and a step of forming a second impurity region that is located higher than, in the perpendicular direction, the gate insulating layer, that is located on a top portion of the semiconductor pillar, and that contains a donor or acceptor impurity, wherein the step of forming the first impurity region includes a step of forming a first material layer so as to surround, in plan view, a side surface of a bottom portion of the semiconductor pillar;

a step of forming a second material layer so as to be located on the first material layer, to surround, with a constant width in plan view, the semiconductor pillar, and to be constituted by a single layer or a plurality of layers in the perpendicular direction;

a step of etching the first material layer through the second material layer serving as a mask, to form an opening portion through which a side surface of a lower portion of the semiconductor pillar is exposed; and a step of forming, by a selective epitaxial crystal growth method, the first impurity region that extends, in plan view, outwardly from the side surface of the semiconductor pillar through the opening portion, and that contains a donor or acceptor impurity.

More preferably, the method includes:

a step of forming the semiconductor pillar by etching a semiconductor layer on the substrate through a mask material layer formed on the semiconductor layer and serving as a mask;

in the step of forming the first impurity region, a step of forming a third material layer on an entirety of a side surface of the semiconductor pillar; and a step of performing oxidation through the mask material layer and the third material layer that serve as anti-oxidation masks to form an oxidized layer in a bottom portion of the semiconductor pillar and in a surface layer of the semiconductor layer, the surface layer being located in an outer peripheral region around the semiconductor pillar.

More preferably, the first impurity region is formed so as to have, in the perpendicular direction, a lower end separated from an upper end of the oxidized layer in the bottom portion of the semiconductor pillar.

More preferably, the first impurity region is formed before the gate insulating layer is formed.

More preferably, the method includes:

a step of, after the first impurity region is formed, removing, with a constant width, an outer peripheral region around the semiconductor pillar, the outer peripheral region being located higher than, in the perpendicular direction, an upper end of the first impurity region; and a step of, after the removing step, forming the gate insulating layer.

More preferably, the method includes:

a step of performing, after the first impurity region is formed, a heat treatment to diffuse a donor or acceptor impurity contained in the first impurity region into the semiconductor pillar to form a third impurity region; and a step of performing the heat treatment to diffuse the donor or acceptor impurity such that an upper end of the third impurity region in the perpendicular direction is located at a lower end of the outer peripheral region around the semiconductor pillar, the lower end being provided by the removing with the constant width.

More preferably, the second material layer includes the gate insulating layer, the gate conductor layer, and a fourth material layer surrounding a side surface of the gate conductor layer.

More preferably, the method includes a step of forming, in the perpendicular direction, a first insulating layer between the gate conductor layer and the first impurity region.

The present invention provides a pillar-shaped semiconductor device having a higher density, a lower power consumption, and a higher speed.

BRIEF DESCRIPTION OF THE DRAWINGS

FIGS. 1OA to 1OC are a plan view and sectional structural views that illustrate a method for producing an SGT-including pillar-shaped semiconductor device according to a first embodiment.

FIGS. 3HA to 3HC are a plan view and sectional structural views that illustrate a method for producing an SGT-including pillar-shaped semiconductor device according to a third embodiment of the present invention.

FIGS. 3IA to 3IC are a plan view and sectional structural views that illustrate a method for producing an SGT-including pillar-shaped semiconductor device according to a third embodiment of the present invention.

FIGS. 4CA to 4CC are a plan view and sectional structural views that illustrate a method for producing an SGT-including pillar-shaped semiconductor device according to a fourth embodiment of the present invention.

DESCRIPTION OF THE PREFERRED EMBODIMENTS

Hereinafter, methods for producing pillar-shaped semiconductor devices according to embodiments of the present invention will be described with reference to drawings.

First Embodiment

Hereinafter, with reference to FIG. 1AA to FIG. 1PC, a method for producing an SGT-including pillar-shaped semiconductor device according to a first embodiment of the present invention will be described. Among FIG. 1AA to FIG. 1PC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 1A:
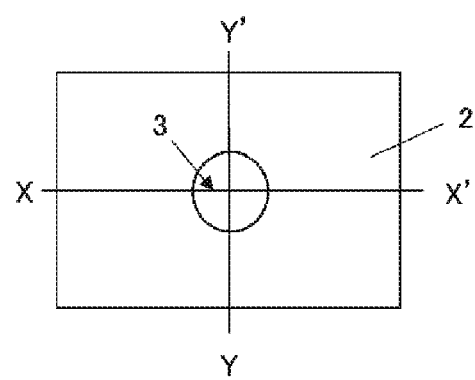
FIGS. 1AA to 1AC are a plan view and sectional structural views that illustrate a method for producing an SGT-including pillar-shaped semiconductor device according to a first embodiment.
Figure 1A:
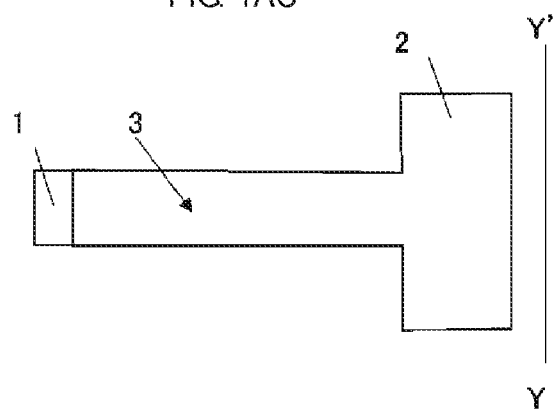
Figure 1A:
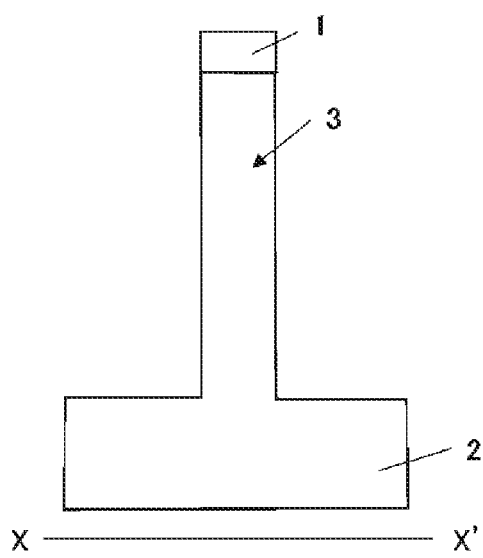

As illustrated in FIGS. 1AA to 1AC, an i-layer (intrinsic Si-layer) substrate (not shown) is etched through, as a mask, a mask material layer 1 formed on the i-layer substrate, having a circular shape in plan view, and including a $SiO_2$ layer, an aluminum oxide ($Al_2O_3$) layer, and a $SiO_2$ layer, to form a Si pillar 3 on the i-layer substrate 2. Incidentally, the i-layer substrate 2 and the Si pillar 3 may be formed of N-type or P-type Si containing a small amount of a donor or acceptor impurity.

Figure 1B:
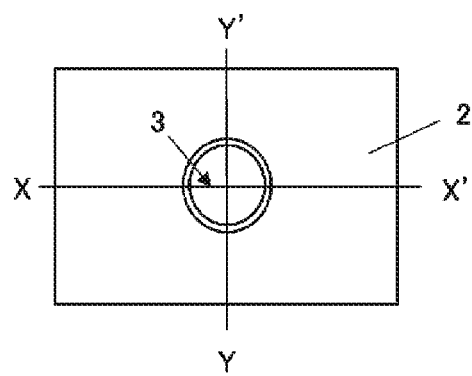
FIGS. 1BA to 1BC are a plan view and sectional structural views that illustrate a method for producing an SGT-including pillar-shaped semiconductor device according to a first embodiment.
Figure 1B:
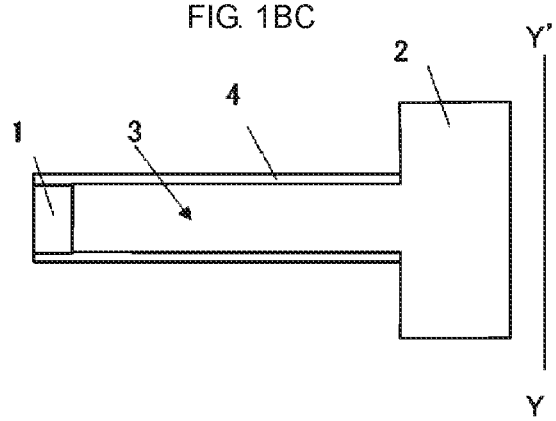
Figure 1B:
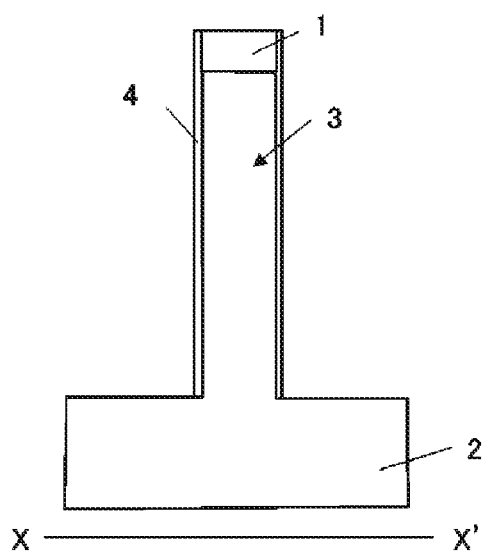

Subsequently, as illustrated in FIGS. 1BA to 1BC, an ALD (Atomic Layer Deposition) method is performed to cover the entire structure with a lower layer that is a $SiO_2$ layer (not shown) and an upper layer that is a SiN layer (not shown). Subsequently, an RIE (Reactive Ion Etching) method is performed to etch off the $SiO_2$ layer and the SiN layer from the top of the i-layer substrate 2 and the mask material layer 1. This leaves a $SiO_2$ layer/SiN layer 4 on the side surfaces of the Si pillar 3 and the mask material layer 1.

Figure 1C:
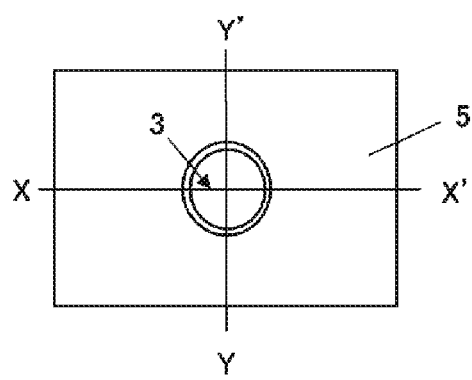
FIGS. 1CA to 1CC are a plan view and sectional structural views that illustrate a method for producing an SGT-including pillar-shaped semiconductor device according to a first embodiment.
Figure 1C:
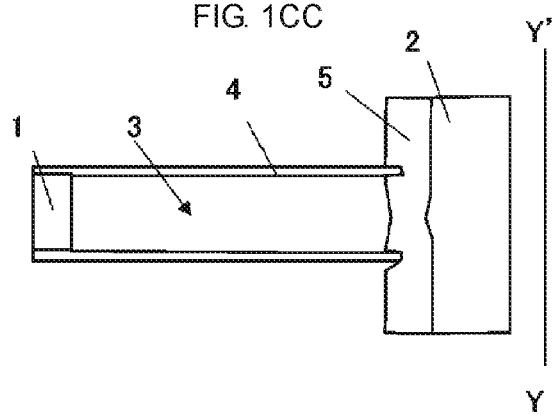
Figure 1C:
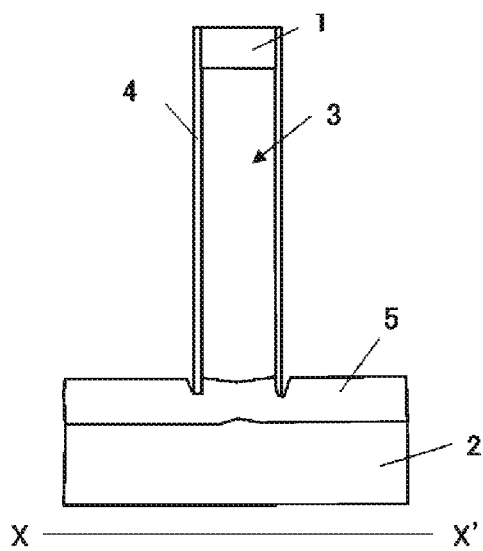

Subsequently, as illustrated in FIGS. 1CA to 1CC, a thermal oxidation method is performed to form a $SiO_2$ layer 5 in the upper surface of the i-layer substrate 2 and in the bottom portion of the Si pillar 3.

Figure 1D:
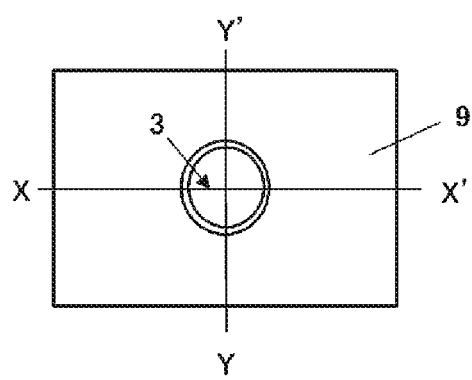
FIGS. 1DA to 1DC are a plan view and sectional structural views that illustrate a method for producing an SGT-including pillar-shaped semiconductor device according to a first embodiment.
Figure 1D:
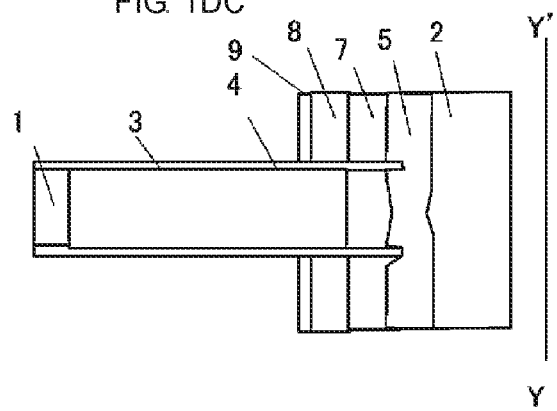
Figure 1D:
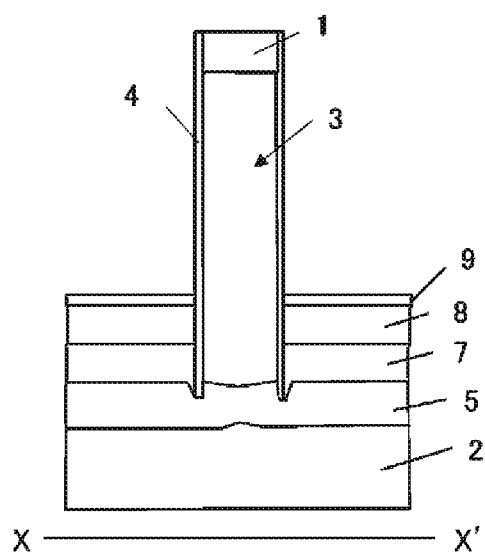

Subsequently, as illustrated in FIGS. 1DA to 1DC, on the $SiO_2$ layer 5 surrounding the Si pillar 3, a SiN layer 7, a $SiO_2$ layer 8, and a SiN layer 9 are formed.

Figure 1E:
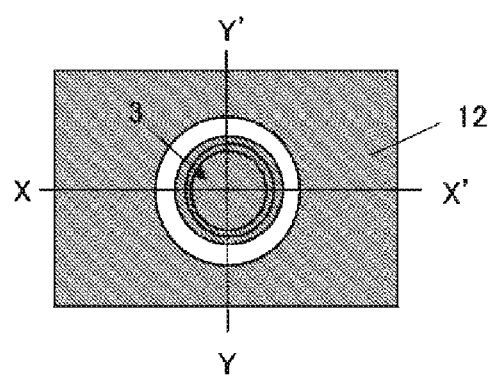
FIGS. 1EA to 1EC are a plan view and sectional structural views that illustrate a method for producing an SGT-including pillar-shaped semiconductor device according to a first embodiment.
Figure 1E:
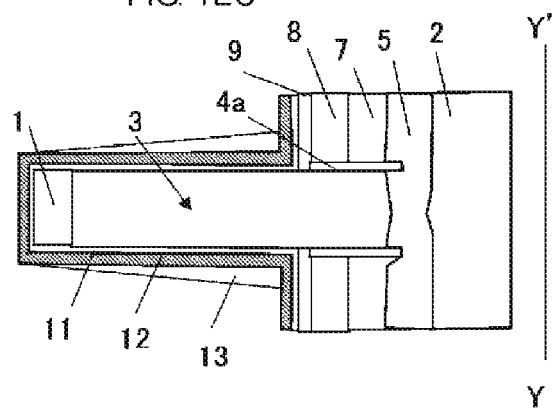
Figure 1E:
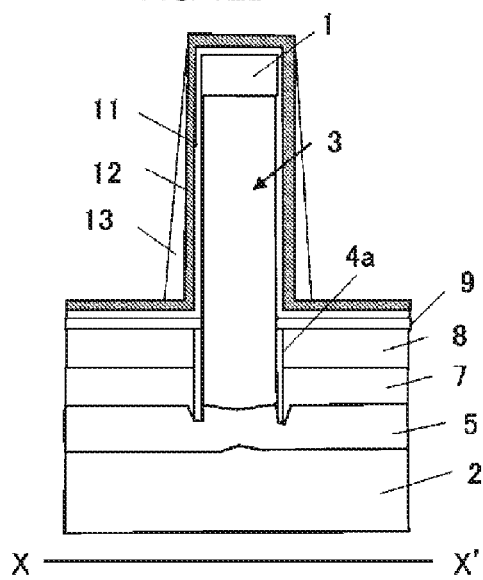

Subsequently, as illustrated in FIGS. 1EA to 1EC, an ALD method is performed to cover the entire structure with a gate insulating layer that is a hafnium oxide ($HfO_2$) layer 11 and a gate conductor layer that is a titanium nitride (TiN) layer 12. Subsequently, the entire structure is covered with a lower layer that is a SiN layer (not shown) and an upper layer that is a $SiO_2$ layer (not shown). Subsequently, an RIE method is performed to etch off the SiN/$SiO_2$ layer on the top portion of and outer peripheral region around the Si pillar 3, to thereby form a SiN/$SiO_2$ layer 13 surrounding the side surface of the Si pillar 3.

Figure 1F:
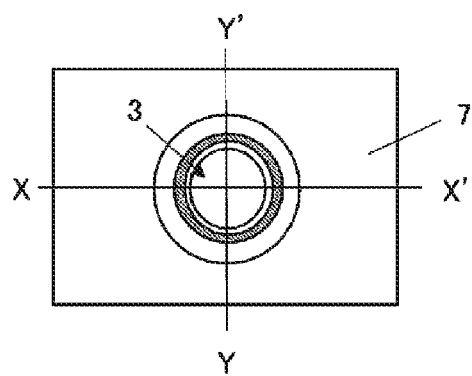
FIGS. 1FA to 1FC are a plan view and sectional structural views that illustrate a method for producing an SGT-including pillar-shaped semiconductor device according to a first embodiment.
Figure 1F:
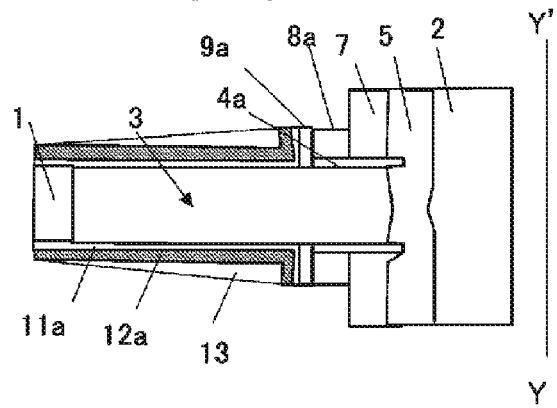
Figure 1F:
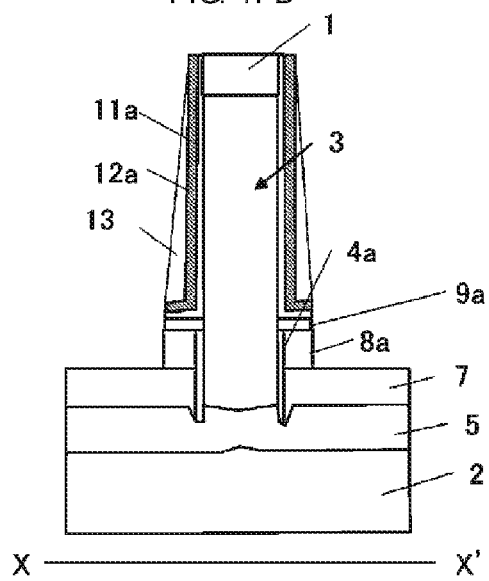

Subsequently, as illustrated in FIGS. 1FA to 1FC, the TiN layer 12, the $HfO_2$ layer 11, the SiN layer 9, and the $SiO_2$ layer 8 are etched through, as masks, the mask material layer 1 and the SiN/$SiO_2$ layer 13, to form a TiN layer 12a, a $HfO_2$ layer 11a, a SiN layer 9a, and a $SiO_2$ layer 8a.

Figure 1G:
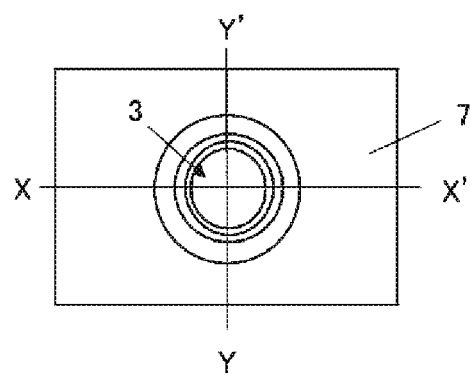
FIGS. 1GA to 1GC are a plan view and sectional structural views that illustrate a method for producing an SGT-including pillar-shaped semiconductor device according to a first embodiment.
Figure 1G:
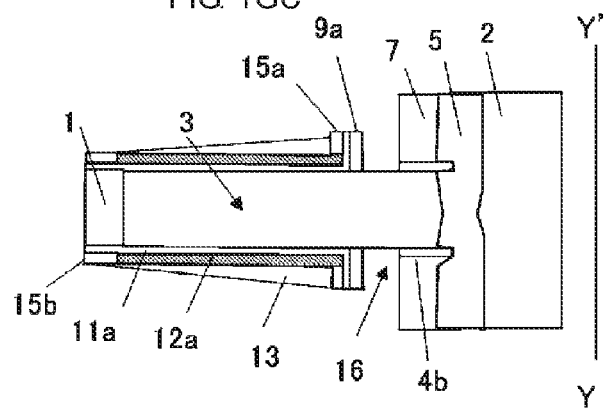
Figure 1G:
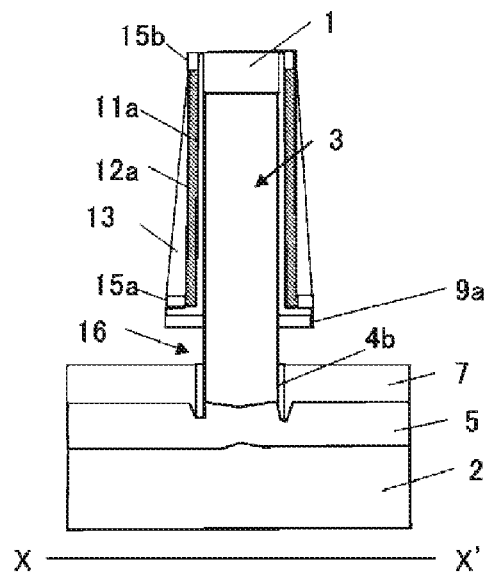

Subsequently, as illustrated in FIGS. 1GA to 1GC, the exposed portions of the TiN layer 12a are oxidized to form oxidized TiN layers 15a and 15b. Subsequently, the $SiO_2$ layer 8a is etched off to form an opening portion 16 through which the side surface of the bottom portion of the Si pillar 3 is exposed.

Figure 1H:
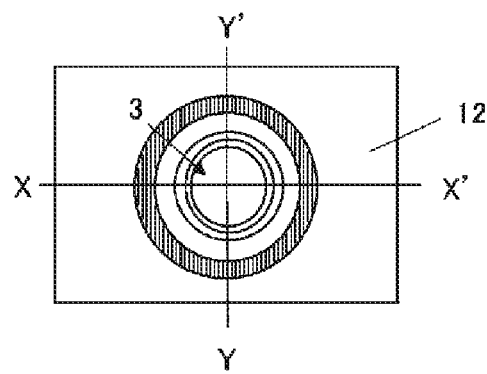
FIGS. 1HA to 1HC are a plan view and sectional structural views that illustrate a method for producing an SGT-including pillar-shaped semiconductor device according to a first embodiment.
Figure 1H:
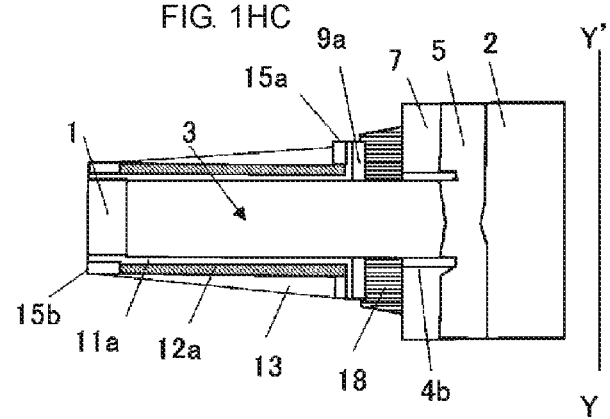
Figure 1H:
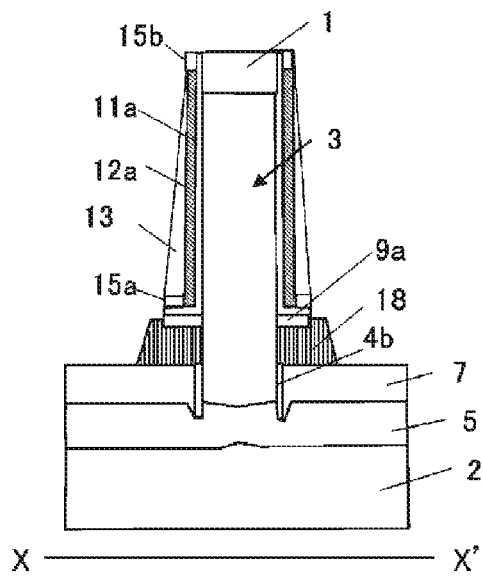

Subsequently, as illustrated in FIGS. 1HA to 1HC, a P+ layer 18 containing an acceptor impurity at a high concentration is formed by a selective epitaxial crystal growth method so as to be in contact with the exposed side surface of the Si pillar 3 in the opening portion 16. The Si pillar 3, which has a circular shape in plan view, enables a reduction in predominance of plane orientations on the side surface of the Si pillar 3. Thus, the P+ layer surrounding the Si pillar 3 is formed so as to have a substantially constant width in plan view.

Figure 1I:
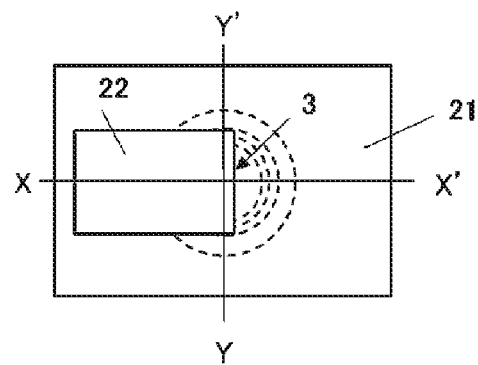
FIGS. 1IA to 1IC are a plan view and sectional structural views that illustrate a method for producing an SGT-including pillar-shaped semiconductor device according to a first embodiment.
Figure 1I:
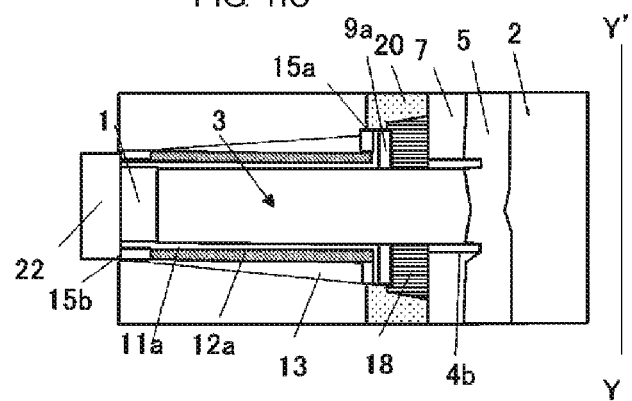
Figure 1I:
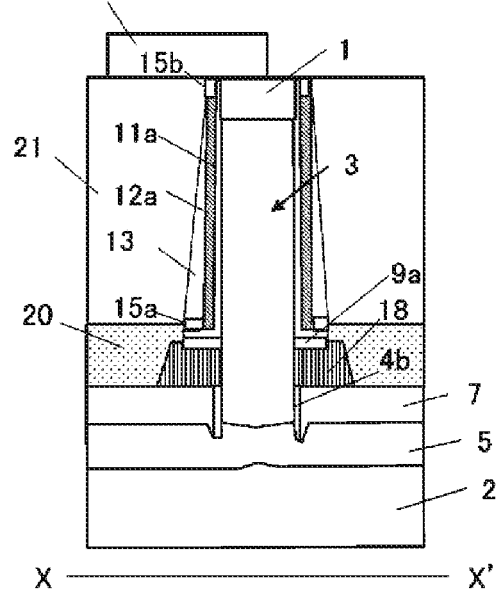

Subsequently, as illustrated in FIGS. 1IA to 1IC, a W layer 20 is formed in contact with the P+ layer 18 and on the SiN layer 7 so as to have an underlying layer that is a thin buffer metal layer (not shown) for reducing the contact resistance with the P+ layer 18. Subsequently, a $SiO_2$ layer (not shown) is formed so as to cover the entire structure. Subsequently, a CMP (Chemical Mechanical Polishing) method is performed to polish the $SiO_2$ layer such that the level of the upper surface is lowered to the level of the upper surface of the mask material layer 1. Thus, a $SiO_2$ layer 21 is formed. Subsequently, on the $SiO_2$ layer 21, a resist layer 22 is formed so as to partially overlap the Si pillar 3 in plan view.

Figure 1J:
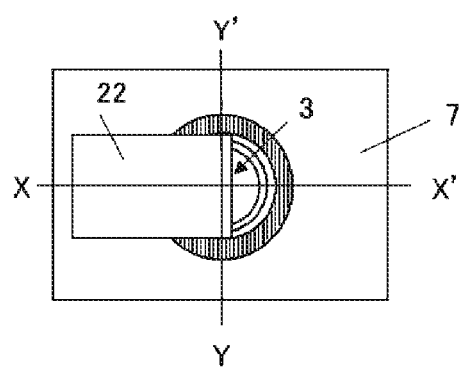
FIGS. 1JA to 1JC are a plan view and sectional structural views that illustrate a method for producing an SGT-including pillar-shaped semiconductor device according to a first embodiment.
Figure 1J:
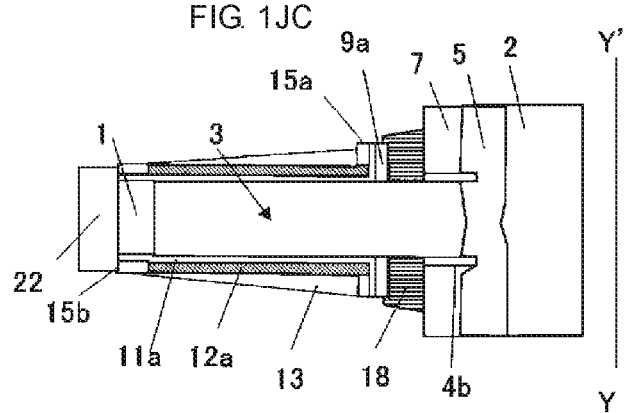
Figure 1J:
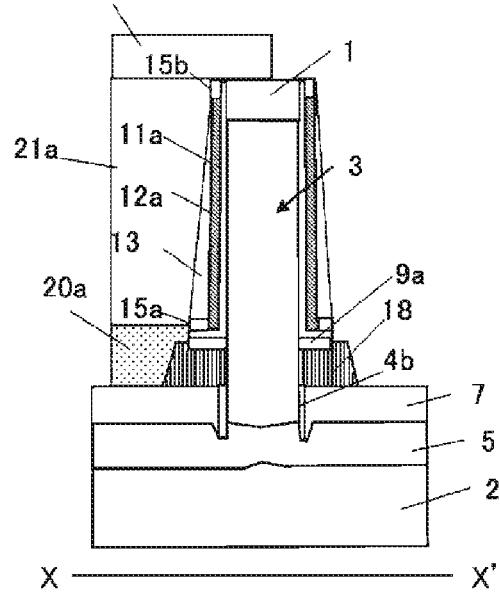

Subsequently, as illustrated in FIGS. 1JA to 1JC, the $SiO_2$ layer 21 and the W layer 20 are etched through, as masks, the mask material layer 1, the SiN/$SiO_2$ layer 13, and the resist layer 22. This forms a P+ layer 18 having, in plan view, a ring shape surrounding the side surface of the Si pillar 3, and a W layer 20a located below the resist layer 22.

Figure 1K:
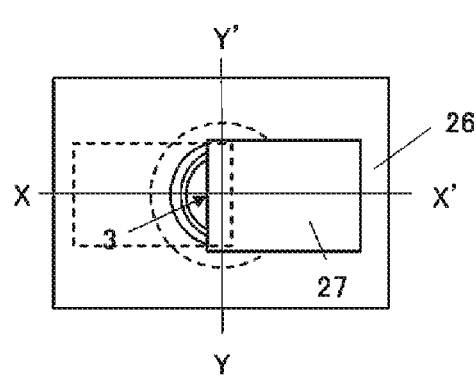
FIGS. 1KA to 1KC are a plan view and sectional structural views that illustrate a method for producing an SGT-including pillar-shaped semiconductor device according to a first embodiment.
Figure 1K:
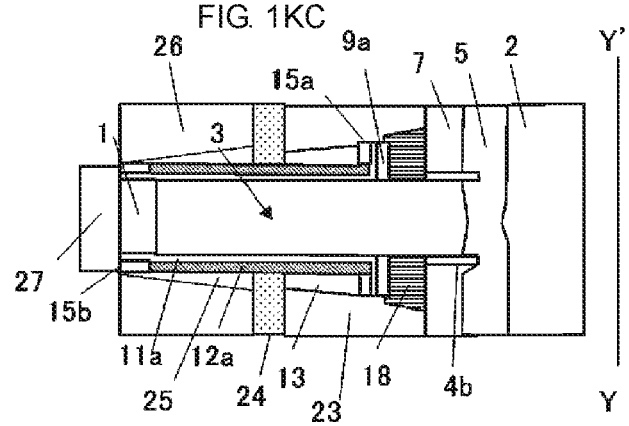
Figure 1K:
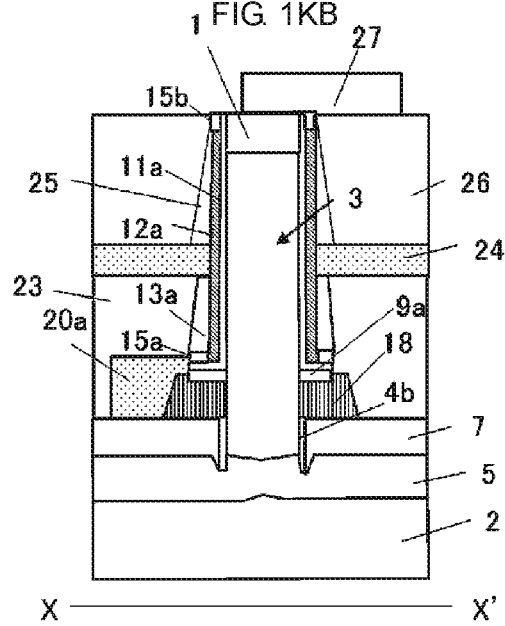

Subsequently, as illustrated in FIGS. 1KA to 1KC, the entire structure is covered with a SiN layer (not shown), and the SiN layer is polished by a CMP method such that the level of the upper surface is lowered to the level of the upper surface of the mask material layer 1. Subsequently, the SiN layer is etched by an etch back method to the middle height of the TiN layer 12a in the perpendicular direction. Thus, a SiN layer 23 is formed. Subsequently, the SiN/$SiO_2$ layer 13 that is located higher than the SiN layer 23 in the perpendicular direction is etched off, to form a SiN/$SiO_2$ layer 13a. Subsequently, a W layer 24 is formed on the SiN layer 23 so as to be in contact with the TiN layer 12a in plan view. Subsequently, the same method as in formation of the SiN/$SiO_2$ layer 13 in FIGS. 1EA to 1EC is performed to form a SiN/$SiO_2$ layer 25. Subsequently, a SiN layer 26 is formed, in plan view, in an outer peripheral region around the SiN/$SiO_2$ layer 25. Subsequently, a resist layer 27 is formed on the SiN layer 26 so as to partially overlap the Si pillar 3 in plan view. The resist layer 27 is formed so as to horizontally extend, in plan view, in a direction opposite to the extension direction of the W layer 20a.

Figure 1L:
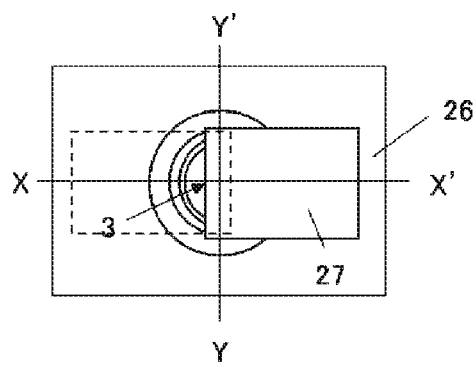
FIGS. 1LA to 1LC are a plan view and sectional structural views that illustrate a method for producing an SGT-including pillar-shaped semiconductor device according to a first embodiment.
Figure 1L:
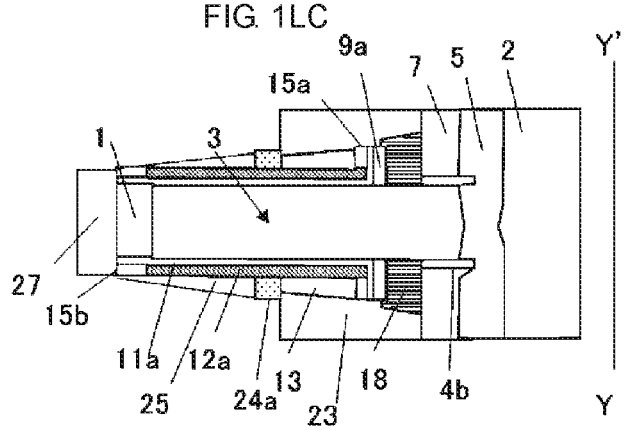
Figure 1L:
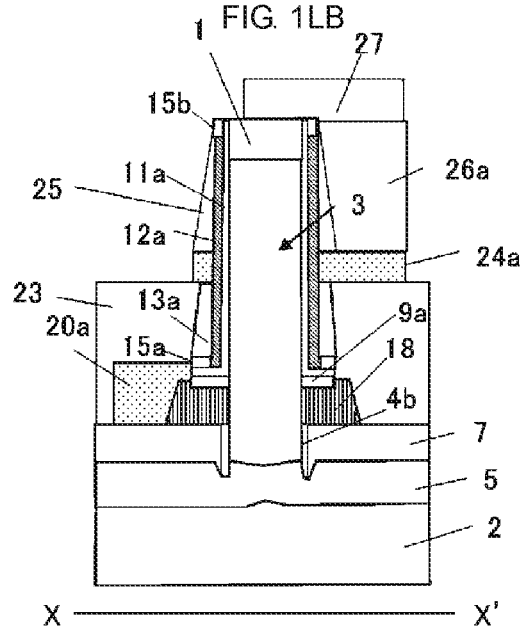

Subsequently, as illustrated in FIGS. 1LA to 1LC, the SiN layer 26 and the W layer 24 are etched through, as masks, the mask material layer 1, the SiN/$SiO_2$ layer 25, and the resist layer 27, to form a W layer 24a and a SiN layer 26a. Subsequently, the resist layer 27 is removed.

Figure 1M:
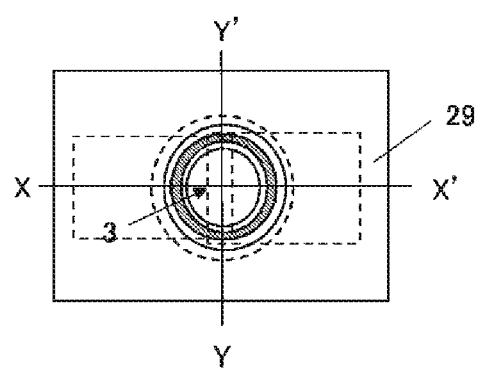
FIGS. 1MA to 1MC are a plan view and sectional structural views that illustrate a method for producing an SGT-including pillar-shaped semiconductor device according to a first embodiment.
Figure 1M:
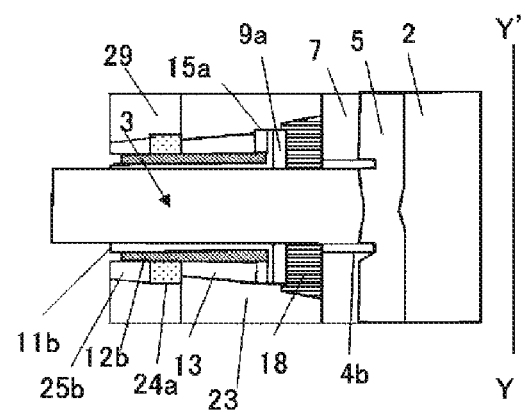
Figure 1M:
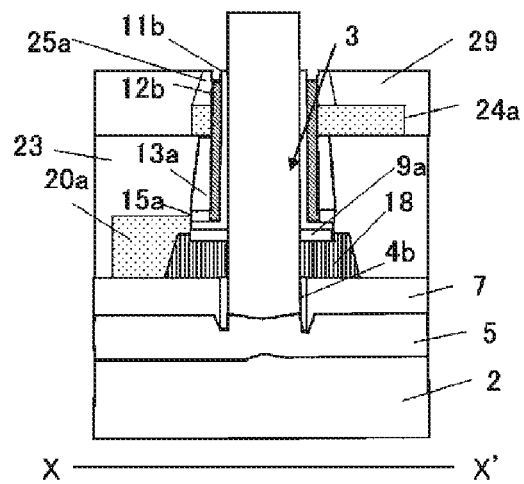

Subsequently, as illustrated in FIGS. 1MA to 1MC, the entire structure is covered with a SiN layer (not shown). Subsequently, the SiN layer is polished by a CMP method such that the level of the upper surface is lowered to the level of the upper surface of the mask material layer 1. Subsequently, the mask material layer 1 is etched to the $Al_2O_3$ layer. The $Al_2O_3$ layer is etched by, for example, a room-temperature RIE method using a boron trichloride ($BCl_3$)

gas. Subsequently, a back etch method is performed to etch the SiN layer, to thereby form a SiN layer 29.

Subsequently, the SiN/SiO$_2$ layer 25, the TiN layer 12a, and the HfO$_2$ layer 11a that are located higher than the SiN layer 29 in the perpendicular direction are etched off, to form a SiN/SiO$_2$ layer 25a, a TiN layer 12b, and a HfO$_2$ layer 11b. Subsequently, the top portion of the TiN layer 12b is etched. Subsequently, the SiO$_2$ layer remaining on the top portion of the Si pillar 3 is removed. Thus, the upper portion of the Si pillar 3 in the perpendicular direction is exposed.

Figure 1N:
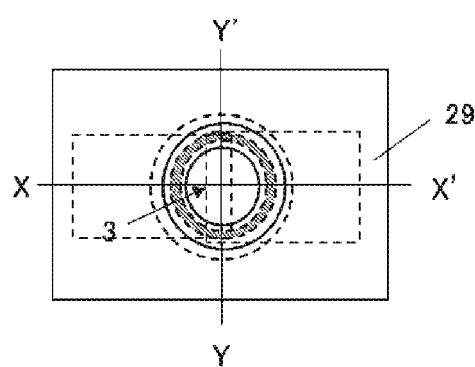
FIGS. 1NA to 1NC are a plan view and sectional structural views that illustrate a method for producing an SGT-including pillar-shaped semiconductor device according to a first embodiment.
Figure 1N:
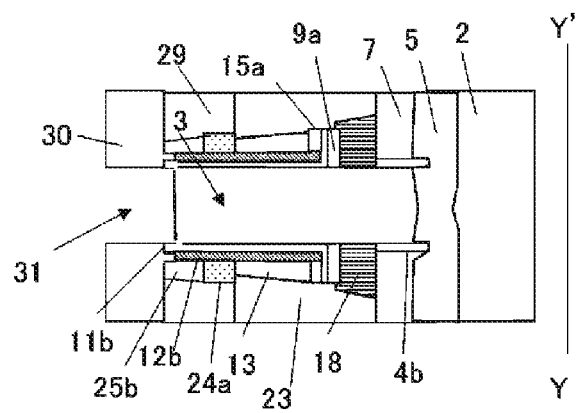
Figure 1N:
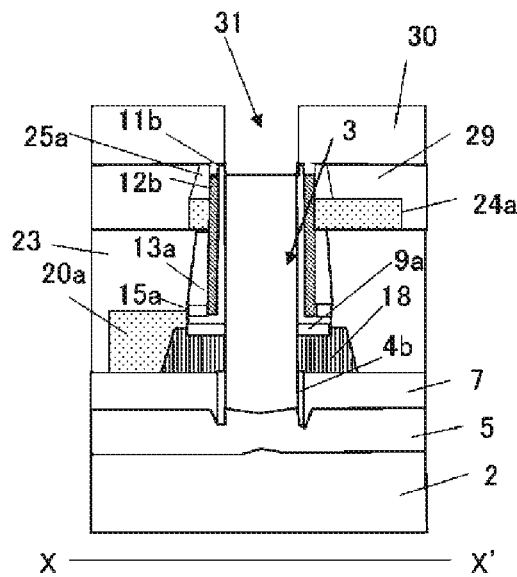

Subsequently, as illustrated in FIGS. 1NA to 1NC, the entire structure is covered with a SiO$_2$ layer (not shown). Subsequently, a CMP method is performed to polish the SiO$_2$ layer such that the level of the upper surface is lowered to the level of the upper surface of the Si pillar 3. Thus, a SiO$_2$ layer 30 is formed. Subsequently, the top portion of the Si pillar 3 is etched through the SiO$_2$ layer 30 serving as a mask to form a recessed portion 31. This etching is performed such that the level (in the perpendicular direction) of the bottom portion of the recessed portion 31 is lowered to the level of the upper end of the TiN layer 12b.

Figure 10A:
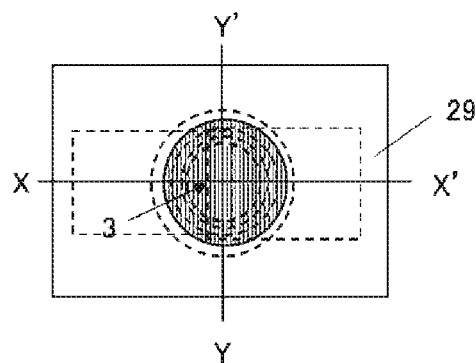
Figure 10C:
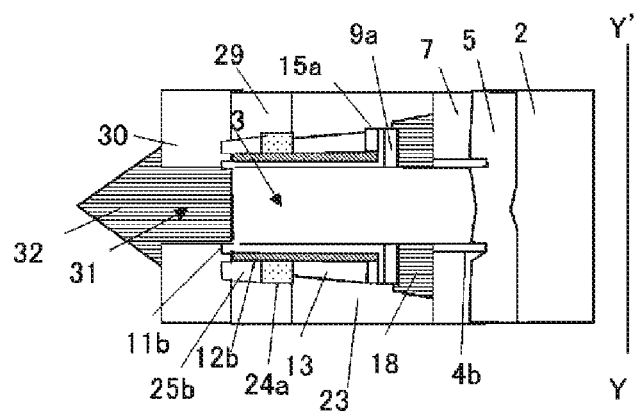
Figure 10B:
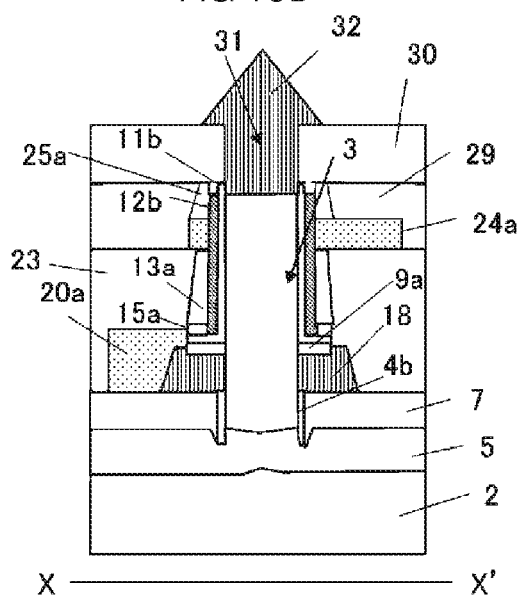

Subsequently, as illustrated in FIGS. 10A to 10C, in the recessed portion 31 above the Si pillar 3, a P$^+$ layer 32 containing an acceptor impurity at a high concentration is formed by a selective epitaxial crystal growth method. In this case, the P$^+$ layer 32 is formed by selective epitaxial crystal growth such that the level (in the perpendicular direction) of the top portion is higher than that of the SiO$_2$ layer 30.

Figure 1P:
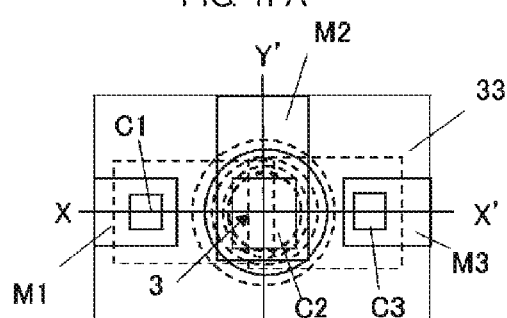
FIGS. 1PA to 1PC are a plan view and sectional structural views that illustrate a method for producing an SGT-including pillar-shaped semiconductor device according to a first embodiment.
Figure 1P:
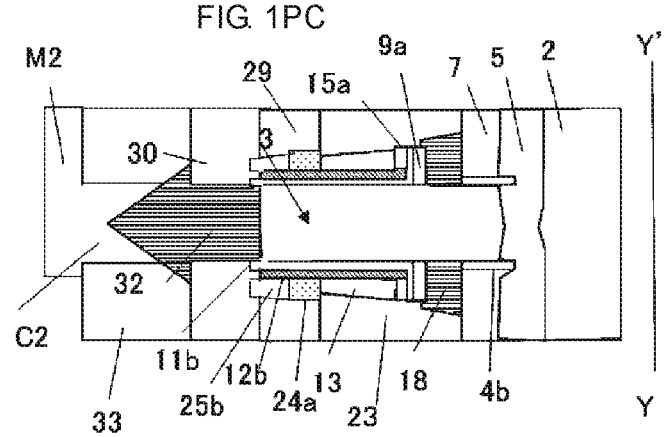
Figure 1P:
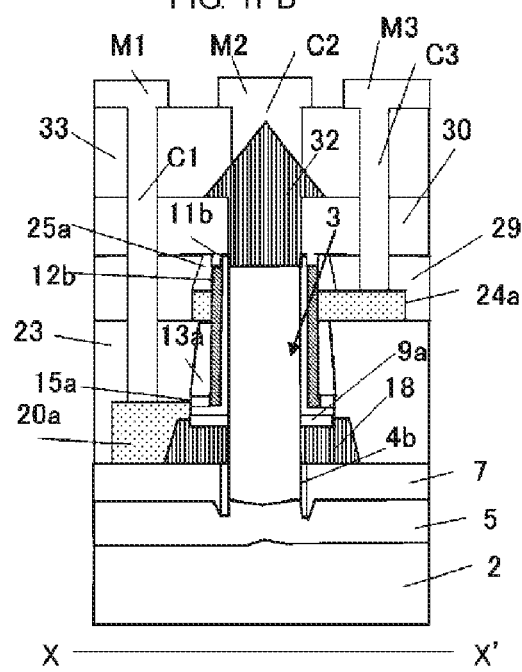

Subsequently, as illustrated in FIGS. 1PA to 1PC, the entire structure is covered with a SiO$_2$ layer (not shown). Subsequently, a CMP method is performed to flatten the surface to thereby form a SiO$_2$ layer 33. Subsequently, the SiO$_2$ layers 33 and 30 and the SiN layers 29 and 23 on the W layer 20a are etched to form a contact hole C1. Subsequently, the SiO$_2$ layer 33 on the P$^+$ layer 32 is etched to form a contact hole C2. Subsequently, the SiO$_2$ layers 33 and 30 and the SiN layer 29 on the W layer 24a are etched to form a contact hole C3. Subsequently, a metal wiring layer M1 is formed so as to be connected through the contact hole C1 to the W layer 20a; a metal wiring layer M2 is formed so as to be connected through the contact hole C2 to the P$^+$ layer 32; and a metal wiring layer M3 is formed so as to be connected through the contact hole C3 to the W layer 24a. Thus, an SGT is formed in which one of the P$^+$ layer 18 and the P$^+$ layer 32 serves as a source and the other serves as a drain; the TiN layer 12b serves as a gate conductor layer; the HfO$_2$ layer 11b serves as a gate insulating layer; and the Si pillar 3 between the P$^+$ layers 18 and 32 serves as a channel.

The production method according to the first embodiment provides the following advantages.

1. The P$^+$ layers 18 and 32 are formed by a selective epitaxial crystal growth method so as to contain an acceptor impurity at a high concentration. This enables formation of PN junctions in which the acceptor impurity concentration sharply changes at the junction interfaces between the Si pillar 3 and the P$^+$ layers 18 and 32. This leads to a decrease in the resistance of the source and drain of the SGT. Regarding such a decrease in the resistance of the source or drain, even in the case of forming one or both of the P$^+$ layer 18 and the P$^+$ layer 32 so as to contain an acceptor impurity at a high concentration by selective epitaxial crystal growth, this leads to a decrease in the resistance of the source or drain.

2. With an increase in the circuit density, the diameter of the Si pillar 3 decreases. In this case, as in the existing technique, when an impurity region for forming a PN junction is formed only within the narrow Si pillar 3, the impurity region is limited within the Si pillar 3, which inevitably results in an increase in the resistance of the PN junction serving as the source or drain. By contrast, in the present invention, an epitaxial crystal growth plane is provided so as to surround the side surface of the bottom portion of the Si pillar 3 without being limited by the diameter of the Si pillar 3, and to have a volume sufficient for low-resistance source and drain and a wide area, to thereby form the P$^+$ layers 18 and 32 having high crystallinity. This achieves a decrease in the resistance of the source and drain.

3. The P$^+$ layers 18 and 32 may be formed of, instead of Si, for example, silicon germanium (SiGe), to thereby generate a stress that enhances the hole mobility within the Si pillar 3. This enables an increase in the speed of the SGT circuit. Alternatively, instead of SiGe, another semiconductor material layer may be selected that contains an acceptor or donor impurity at a high concentration and can be formed by selective epitaxial crystal growth, to thereby form a P-channel type or N-channel type SGT. Use of a semiconductor material for forming the channel of the SGT and a different semiconductor material for forming the source or drain provides a high-performance SGT circuit.

4. The SiO$_2$ layer 5 formed in the bottom portion of the Si pillar 3 and the P$^+$ layers 18 and 32 formed of SiGe enable generation of a stress that further increases the hole mobility within the Si pillar 3. This enables a further increase in the speed of the SGT circuit.

5. The SiO$_2$ layer 5 is formed by a thermal oxidation method using, as masks, the mask material layer 1 and the SiO$_2$ layer/SiN layer 4 covering the Si pillar 3, so as to be in the bottom portion of the Si pillar 3 and in the upper surface of the i-layer substrate 2. In addition, while the SiO$_2$ layer/SiN layer 4 is left on the side surface of the bottom portion of the Si pillar 3, the P$^+$ layer 18 is formed so as to be located above (in the perpendicular direction) and separated from the upper end of the SiO$_2$ layer 5. This enables prevention of overlapping of the SiO$_2$ layer 5 and the P$^+$ layer 18 in the perpendicular direction. This enables prevention of an increase in the resistance of the source or drain caused by overlapping of the SiO$_2$ layer 5 and the P$^+$ layer 18 and by the resultant decrease in the contact area between the P$^+$ layer 18 and the Si surface of the side surface of the Si pillar 3. In addition, the side surface of the bottom portion of the Si pillar 3 on which the P$^+$ layer 18 is grown by selective epitaxial crystal growth can be separated from the interface (where stress concentration occurs) between the Si pillar 3 and the SiO$_2$ layer 5. This enables formation of the P$^+$ layer 18 of high crystallinity on the side surface of the bottom portion of the Si pillar 3.

6. The P$^+$ layer 32 is formed so as to have a lower portion of the P$^+$ layer 32 and an upper portion of the P$^+$ layer 32. The lower portion of the P$^+$ layer 32 is formed so as to be connected to the upper surface of the Si pillar 3, and so as to extend upwardly in the perpendicular direction while, in plan view of the upper surface of the Si pillar 3, the shape of the top portion of the Si pillar 3 is kept. The upper portion of the P$^+$ layer 32 is formed so as to be connected to the upper surface of the lower portion, and so as to have an outer peripheral edge extending, in plan view of the upper surface of the lower portion, beyond the outer peripheral edge of the lower portion of the P$^+$ layer 32. In this way, the upper-portion P$^+$ layer 32 can be formed so as to have, in plan view, a larger area than the Si pillar 3. In this case, the contact hole C2 for connection between the metal wiring layer M2 and the P$^+$ layer 32 can be formed with a sufficiently high tolerance of mask alignment.

Second Embodiment

Hereinafter, a method for producing an SGT-including pillar-shaped semiconductor device according to a second embodiment of the present invention will be described with reference to FIG. 2AA to FIG. 2CC. Among FIG. 2AA to FIG. 2CC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method of the second embodiment is the same as in the above-described steps of the first embodiment except for the following differences.

Figure 2A:
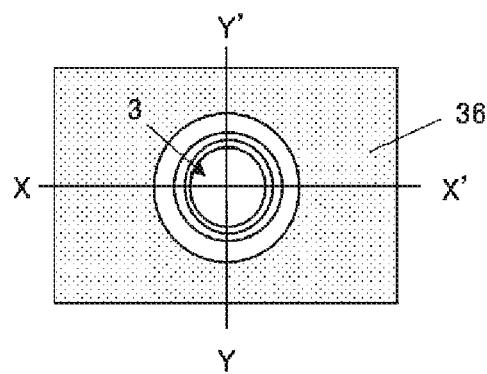
FIGS. 2AA to 2AC are a plan view and sectional structural views that illustrate a method for producing an SGT-including pillar-shaped semiconductor device according to a second embodiment of the present invention.
Figure 2A:
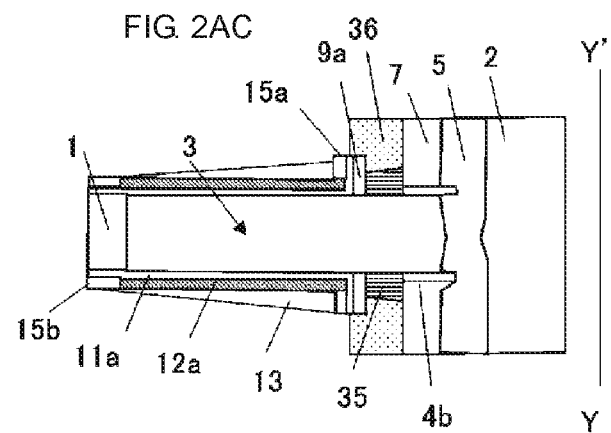
Figure 2A:
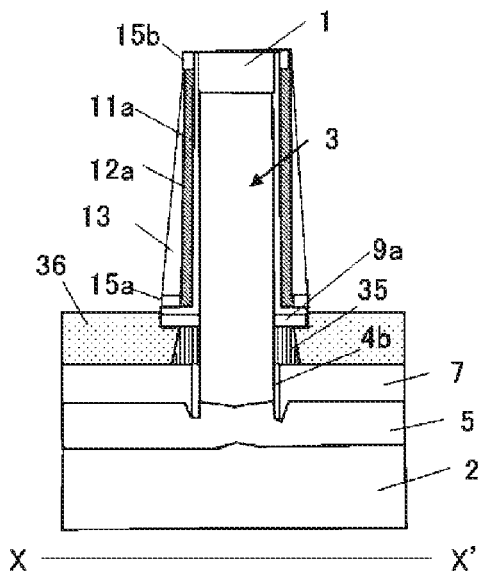

The same steps as in FIG. 1AA to FIG. 1GC are performed prior to a step illustrated in FIGS. 2AA to 2AC. Subsequently, a $P^+$ layer 35 containing an acceptor impurity at a high concentration is formed by a selective epitaxial crystal growth method so as to be in contact with the exposed side surface of the bottom portion of the Si pillar 3. In this case, the outer periphery of the $P^+$ layer 35 is formed so as to be, in plan view, within the outer periphery of the SiN/SiO$_2$ layer 13. Subsequently, an ALD method and a CVD (Chemical Vapor Deposition) method are performed to cover the entire structure with a W layer (not shown). Subsequently, the W layer is polished by a CMP method such that the level of the upper surface is lowered to the level of the upper surface of the mask material layer 1. Subsequently, the W layer is etched by an etch back method to form a W layer 36 connected to the $P^+$ layer 35. Incidentally, before the W layer 36 is formed, a barrier metal layer for achieving a decrease in the resistance between the $P^+$ layer 35 and the W layer 36, such as a Ta layer, may be formed between the $P^+$ layer 35 and the W layer 36. In this case, in plan view, the Ta layer is formed so as to surround, with a constant width, the $P^+$ layer 35.

Figure 2B:
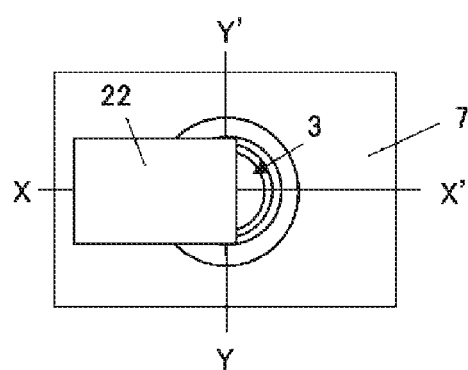
FIGS. 2BA to 2BC are a plan view and sectional structural views that illustrate a method for producing an SGT-including pillar-shaped semiconductor device according to a second embodiment.
Figure 2B:
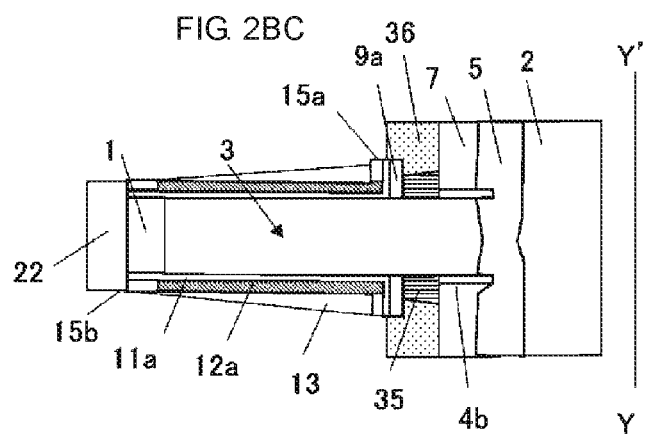
Figure 2B:
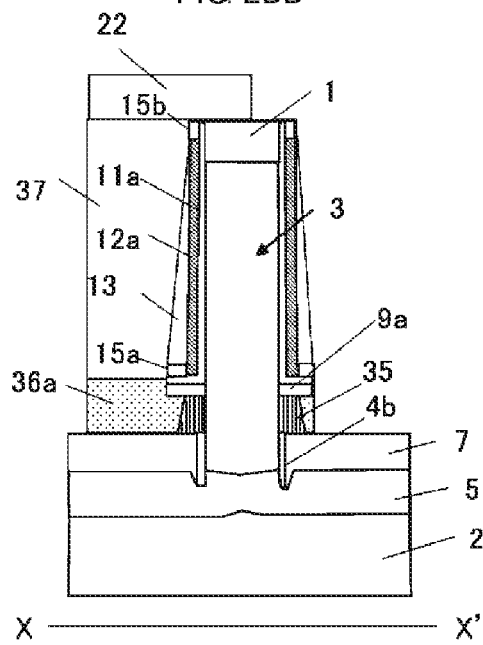
Figure 2C:
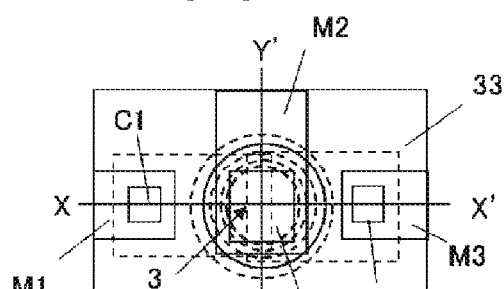
FIGS. 2CA to 2CC are a plan view and sectional structural views that illustrate a method for producing an SGT-including pillar-shaped semiconductor device according to a second embodiment.
Figure 2C:
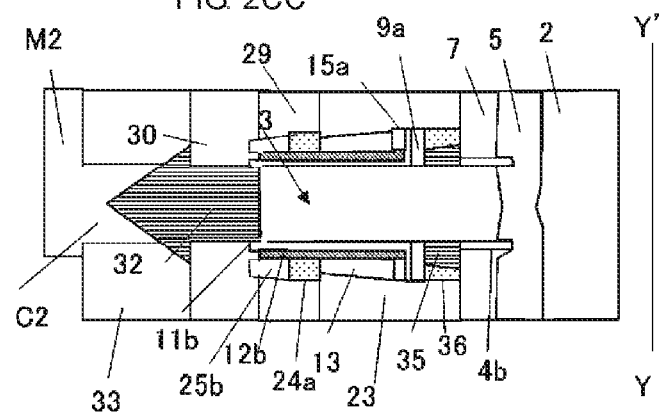
Figure 2C:
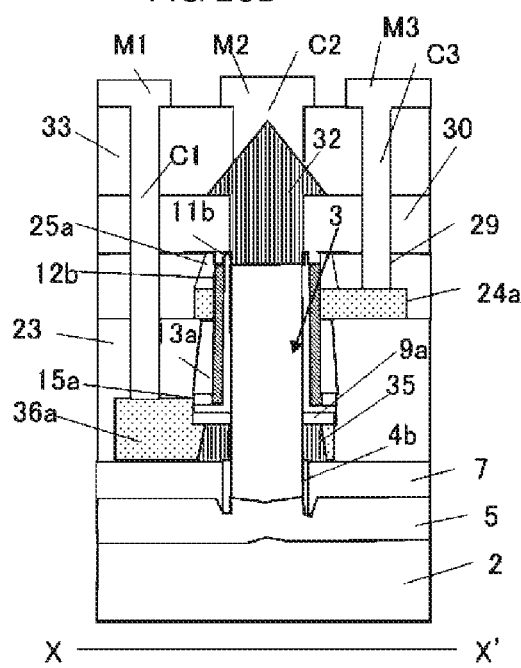

Subsequently, as illustrated in FIGS. 2BA to 2BC, the entire structure is covered with a SiO$_2$ layer (not shown). The SiO$_2$ layer is polished by a CMP method such that the level of the upper surface is lowered to the level of the upper surface of the mask material layer 1. Subsequently, in plan view, a resist layer 22 is formed so as to partially overlap the Si pillar 3. Subsequently, the SiO$_2$ layer and the W layer 36 are etched through, as masks, the SiN/SiO$_2$ layer 13, the mask material layer 1, and the resist layer 22, to thereby form a SiO$_2$ layer 37 and a W layer 36a. Subsequently, the resist layer 22 is removed. In this case, the W layer 36a is formed so as to surround the whole periphery of the $P^+$ layer 35 in plan view.

Subsequently, the same steps as in FIG. 1KA to FIG. 1PC are performed to thereby form an SGT illustrated in FIGS. 2CA to 2CC.

The method for producing an SGT-including pillar-shaped semiconductor device according to this embodiment provides the following advantages.

1. In the first embodiment, the W layer 20a is in contact with, in plan view, a portion of the outer periphery of the $P^+$ layer 18. The W layer 20a does not surround the whole periphery of the $P^+$ layer 18. By contrast, in this embodiment, the W layer 36a is formed so as to surround, in plan view, with a constant width, the whole periphery of the $P^+$ layer 35. In such a case where the W layer 36a surrounds, with a constant width, the whole periphery of the $P^+$ layer 35, a reduction in the connection resistance between the $P^+$ layer 35 and the W layer 36a is achieved. This enables a further increase in the speed of the SGT circuit.

2. In this embodiment, the W layer 36 surrounding the Si pillar 3 in plan view is etched through the SiN/SiO$_2$ layer 13 serving as a mask. The SiN/SiO$_2$ layer 13 is formed, with respect to the Si pillar 3, in a self-alignment manner that does not cause mask misalignment in lithography. Thus, the W layer 36a surrounding the whole periphery of the $P^+$ layer 35 in plan view is formed with high accuracy so as to have a small area. This enables a high-density SGT circuit.

Third Embodiment

Hereinafter, a method for producing an SGT-including pillar-shaped semiconductor device according to a third embodiment of the present invention will be described with reference to FIG. 3AA to FIG. 3IC. Among FIG. 3AA to FIG. 3IC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 3A:
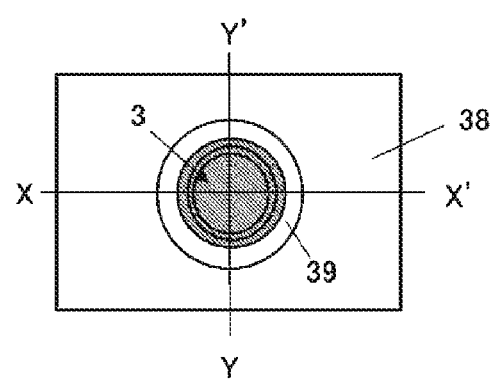
FIGS. 3AA to 3AC are a plan view and sectional structural views that illustrate a method for producing an SGT-including pillar-shaped semiconductor device according to a third embodiment of the present invention.
Figure 3A:
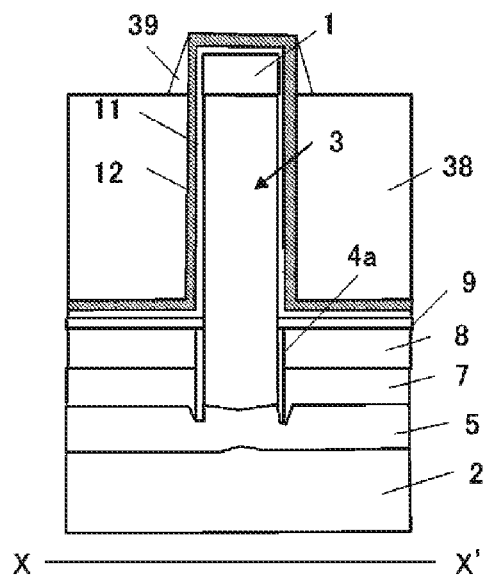
Figure 3A:
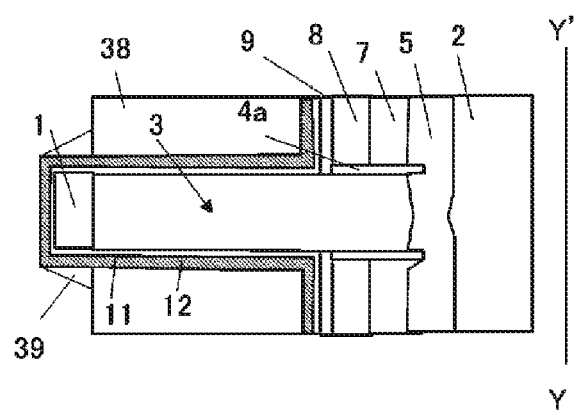

The steps as in FIG. 1AA to FIG. 1EC prior to formation of the SiN/SiO$_2$ layer 13 are performed prior to the step illustrated in FIGS. 3AA to 3AC. Subsequently, the entire structure is covered with a SiO$_2$ layer (not shown). The SiO$_2$ layer is polished by a CMP method such that the level of the upper surface is lowered to the level of the upper surface of the mask material layer 1. Subsequently, an etch back method is performed to etch the SiO$_2$ layer, to thereby form a SiO$_2$ layer 38. The level of the upper surface of this SiO$_2$ layer 38 is desirably located (in the perpendicular direction) at the level of the lower end of the mask material layer 1. Subsequently, a SiN/SiO$_2$ layer 39 is formed on the SiO$_2$ layer 38 so as to surround the side surface of the top portion of the Si pillar 3 by the same method as in the formation of the SiN/SiO$_2$ layer 13.

Figure 3B:
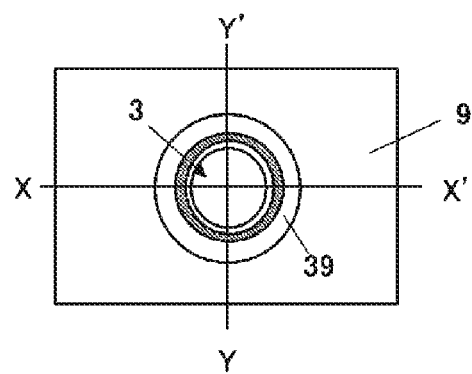
FIGS. 3BA to 3BC are a plan view and sectional structural views that illustrate a method for producing an SGT-including pillar-shaped semiconductor device according to a third embodiment of the present invention.
Figure 3B:
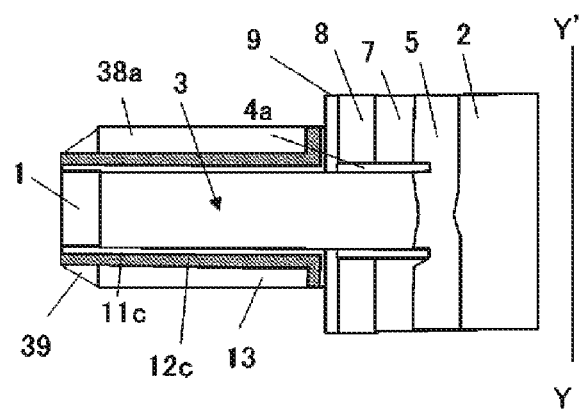
Figure 3B:
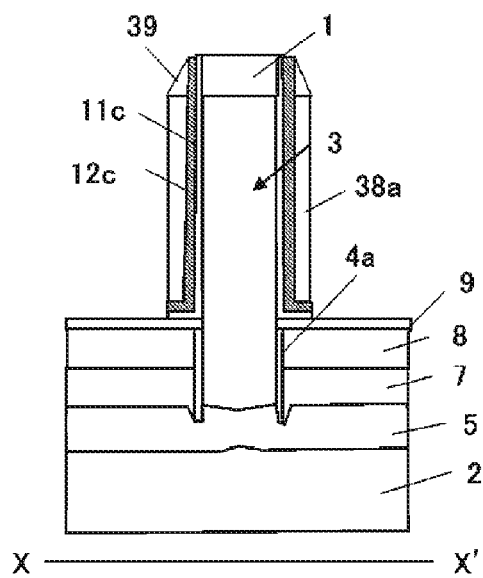

Subsequently, as illustrated in FIGS. 3BA to 3BC, the SiO$_2$ layer 38, the TiN layer 12, and the HfO$_2$ layer 11 are etched through the SiN/SiO$_2$ layer 39 serving as a mask, to thereby form a SiO$_2$ layer 38a, a TiN layer 12c, and a HfO$_2$ layer 11c surrounding the Si pillar 3.

Figure 3C:
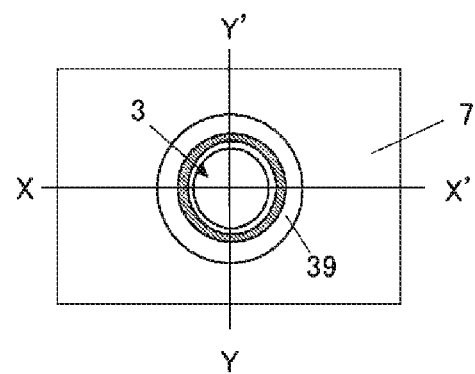
FIGS. 3CA to 3CC are a plan view and sectional structural views that illustrate a method for producing an SGT-including pillar-shaped semiconductor device according to a third embodiment of the present invention.
Figure 3C:
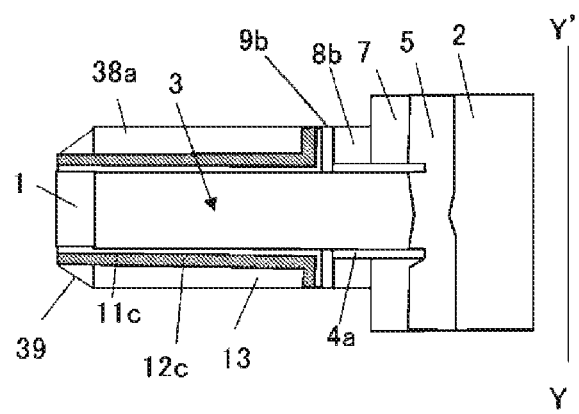
Figure 3C:
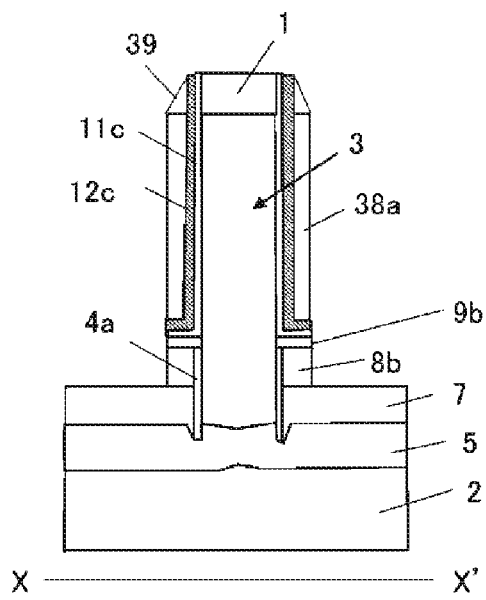

Subsequently, as illustrated in FIGS. 3CA to 3CC, the SiN layer 9 and the SiO$_2$ layer 8 are etched through the SiN/SiO$_2$ layer 39 serving as a mask, to form a SiN layer 9b and a SiO$_2$ layer 8b surrounding the Si pillar 3.

Figure 3D:
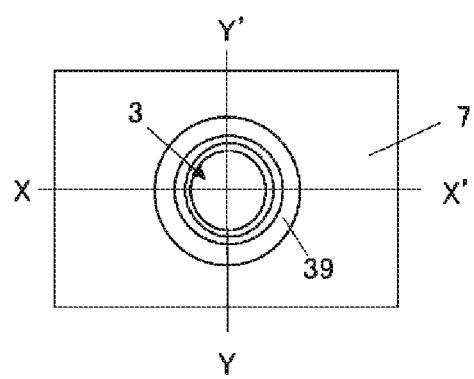
FIGS. 3DA to 3DC are a plan view and sectional structural views that illustrate a method for producing an SGT-including pillar-shaped semiconductor device according to a third embodiment of the present invention.
Figure 3D:
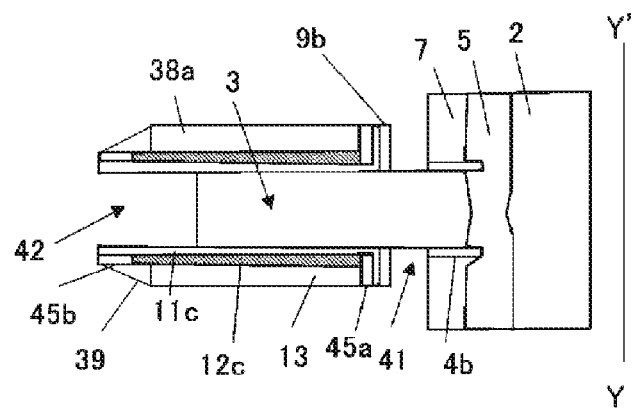
Figure 3D:
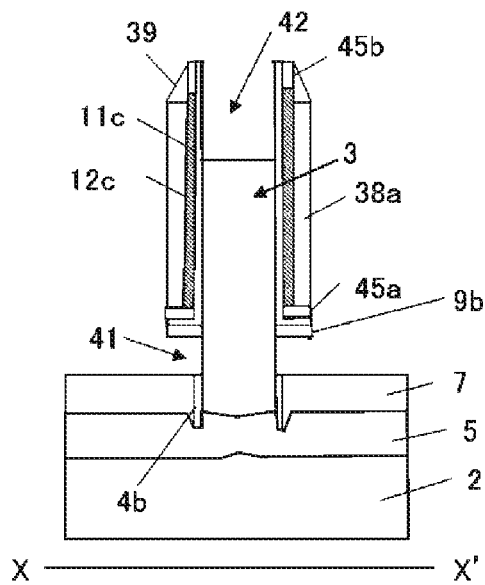

Subsequently, as illustrated in FIGS. 3DA to 3DC, the upper and lower exposed portions of the TiN layer 12c are oxidized to form TiNO layers 45a and 45b. Subsequently, the mask material layer 1 is removed. Subsequently, the top portion of the Si pillar 3 is etched to form a recessed portion 42. Subsequently, the SiO$_2$ layer 8b and the SiO$_2$ layer/SiN layer 4a located on the side surface of the bottom portion of the Si pillar 3 are etched off to expose the side surface of the bottom portion of the Si pillar 3. Thus, an opening portion 41 is formed.

Figure 3E:
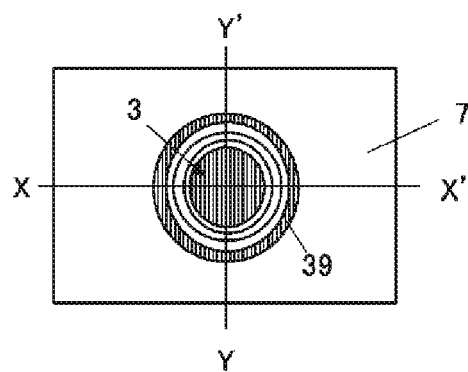
FIGS. 3EA to 3EC are a plan view and sectional structural views that illustrate a method for producing an SGT-including pillar-shaped semiconductor device according to a third embodiment of the present invention.
Figure 3E:
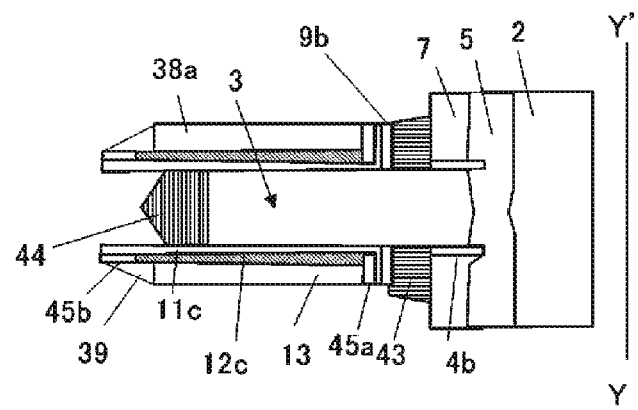
Figure 3E:
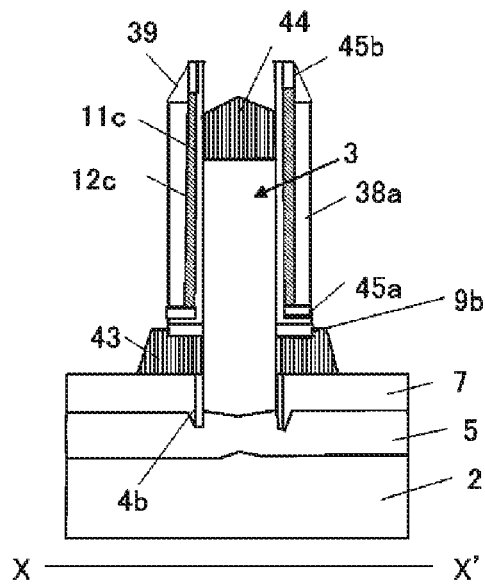

Subsequently, as illustrated in FIGS. 3EA to 3EC, a selective epitaxial crystal growth method is performed to form $P^+$ layers 43 and 44 in the opening portion 41 of the bottom portion of and the recessed portion 42 of the top portion of the Si pillar 3 so as to be in contact with the Si pillar 3 and contain an acceptor impurity at a high concentration.

Figure 3F:
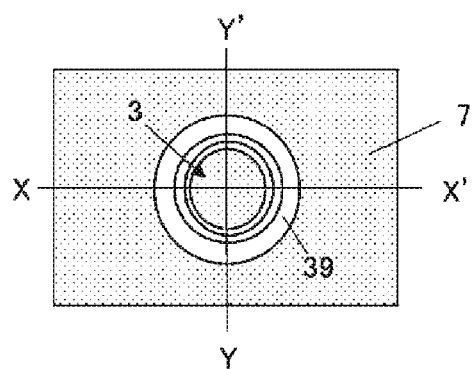
FIGS. 3FA to 3FC are a plan view and sectional structural views that illustrate a method for producing an SGT-including pillar-shaped semiconductor device according to a third embodiment of the present invention.
Figure 3F:
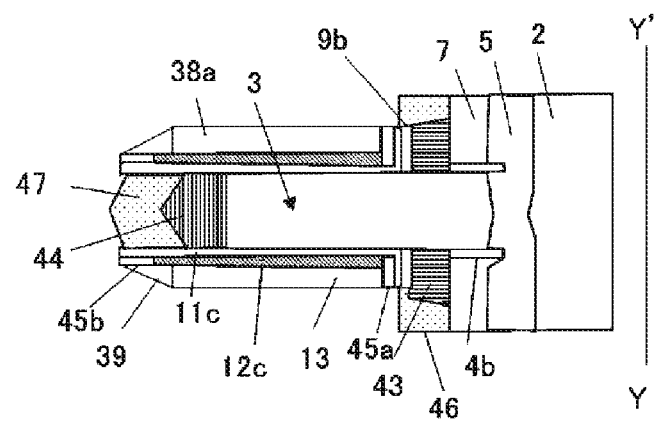
Figure 3F:
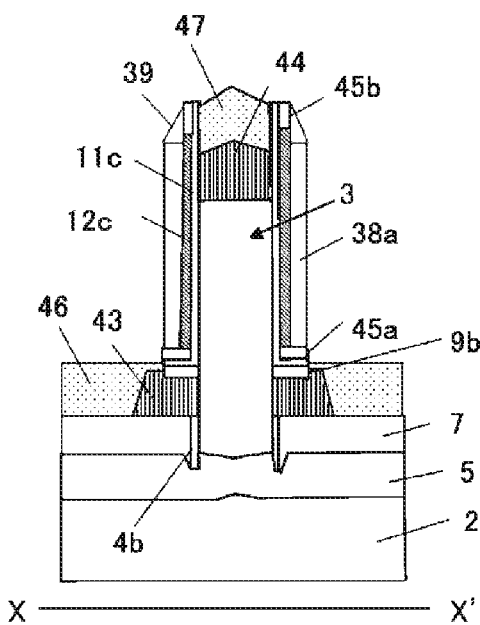

Subsequently, as illustrated in FIGS. 3FA to 3FC, a tantalum (Ta) sputtering deposition method is performed to form a Ta layer 47 on the $P^+$ layer 44 and a Ta layer 46 in contact with the $P^+$ layer 43 and on the SiN layer 7 disposed in an outer peripheral region around the Si pillar. This Ta sputtering deposition is performed such that the deposition acceleration voltage is adjusted so as not to cause deposition on the perpendicular side surface of the SiO$_2$ layer 38a (refer to C. Y. Ting, V. J. Vivalda, and H. G. Schaefer: "Study of planarized sputter-deposited SiO$_2$", J. Vac. Sci. Technol. 15(3), p.p. 1105-1112, May/June (1978)). Subsequently, the entire structure is subjected to mild Ta etching, to remove Ta adhering to the side surface of the SiN/SiO$_2$ layer 39.

Figure 3G:
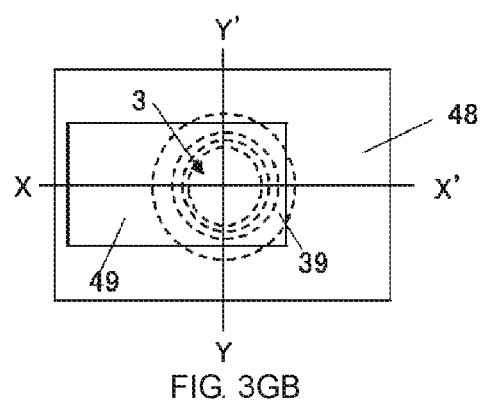
FIGS. 3GA to 3GC are a plan view and sectional structural views that illustrate a method for producing an SGT-including pillar-shaped semiconductor device according to a third embodiment of the present invention.
Figure 3G:
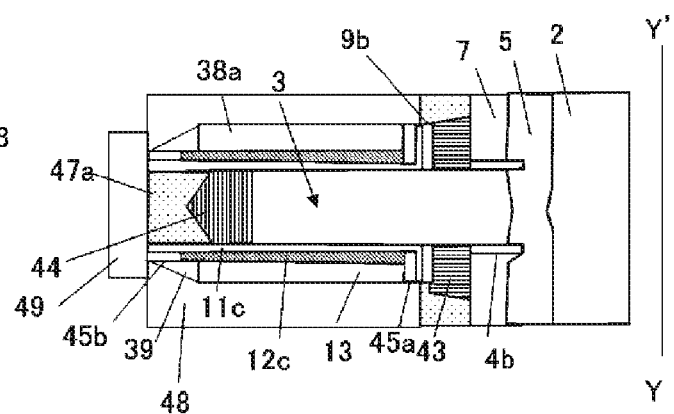
Figure 3G:
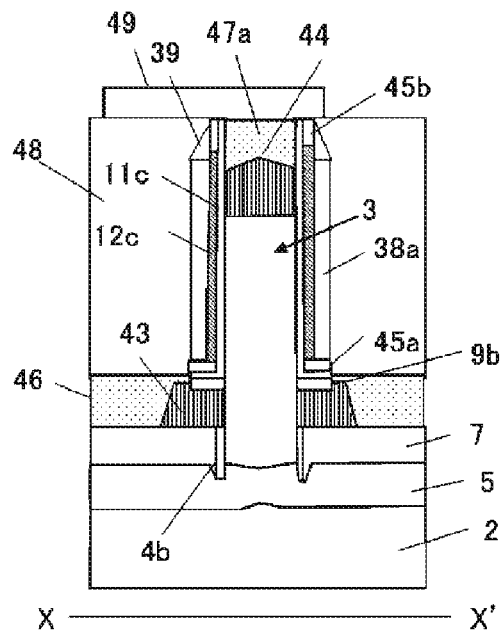
Figure 31A:
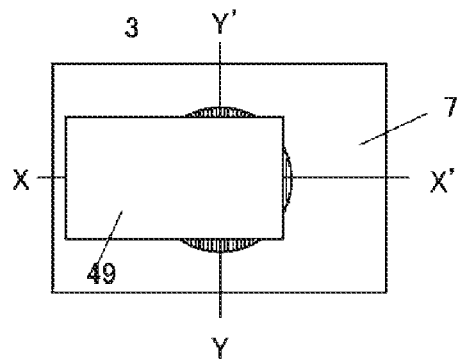
Figure 31C:
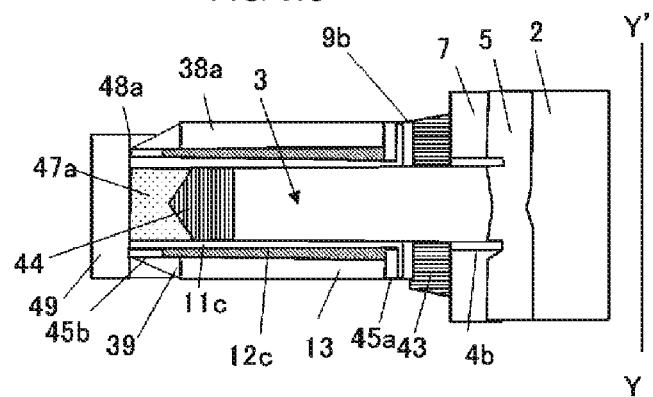
Figure 31B:
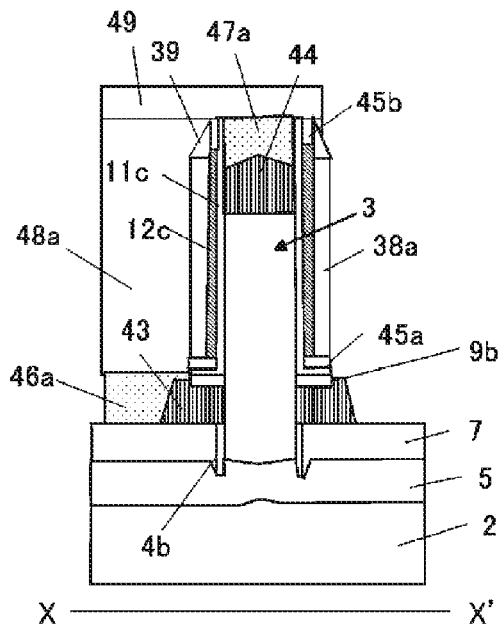

Subsequently, as illustrated in FIGS. 3GA to 3GC, the entire structure is covered with a SiO$_2$ layer (not shown), and the SiO$_2$ layer and the Ta layer 47 are polished by a CMP method such that the level of the upper surfaces of these layers is lowered to the level of the upper surface of the TiNO layer 45b. Thus, a SiO$_2$ layer 48 and a Ta layer 47a having a flat upper surface are formed. Subsequently, a resist layer 49 is formed so as to cover the Si pillar in plan view.

Subsequently, as illustrated in FIGS. 3HA to 3HC, the SiO$_2$ layer 48 is etched through, as masks, the resist layer 49 and the SiN/SiO$_2$ layer 39, to form a SiO$_2$ layer 48a.

Subsequently, as illustrated in FIGS. 3IA to 3IC, the Ta layer 46 is etched through, as masks, the resist layer 49 and the SiN/SiO$_2$ layer 39, to form a Ta layer 46a serving as a wiring conductor layer. Subsequently, the resist layer 49 is removed. Subsequently, the steps as in FIG. 1KA to FIG. 1PC are performed to form an SGT on the i-layer substrate 2. The Ta layer 47a serves as a connection conductor layer to the upper wiring conductor layer.

The method for producing an SGT-including pillar-shaped semiconductor device according to this embodiment provides the following advantages.

1. In this embodiment, as illustrated in FIGS. 3EA to 3EC, the P$^+$ layers 43 and 44 are simultaneously formed by a selective epitaxial crystal growth method. This enables simplification of the steps of SGT production, and the resultant method also provides an SGT having the same features as in the first embodiment.

2. In this embodiment, in plan view, the outer peripheries of the P$^+$ layer 44 and the Ta layer 47a serving as a connection conductor layer, which are disposed above the top portion of the Si pillar 3, are formed so as to extend upward as with the outer periphery of the Si pillar 3. Since the Ta layer 47a has a low resistance, a connection region between the Ta layer 47a and the upper wiring conductor layer may be connected to, in plan view, only a portion of the Ta layer 47a. This provides a high-density SGT circuit.

Fourth Embodiment

Hereinafter, a method for producing an SGT-including pillar-shaped semiconductor device according to a fourth embodiment of the present invention will be described with reference to FIG. 4AA to FIG. 4EC. Among FIG. 4AA to FIG. 4EC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 4A:
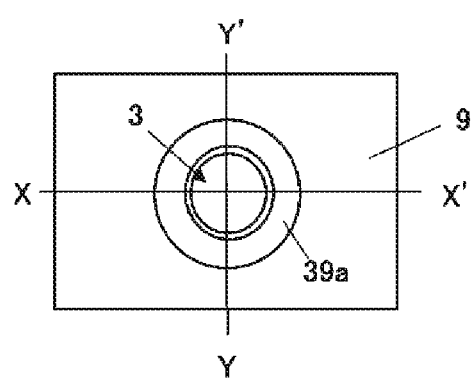
FIGS. 4AA to 4AC are a plan view and sectional structural views that illustrate a method for producing an SGT-including pillar-shaped semiconductor device according to a fourth embodiment of the present invention.
Figure 4A:
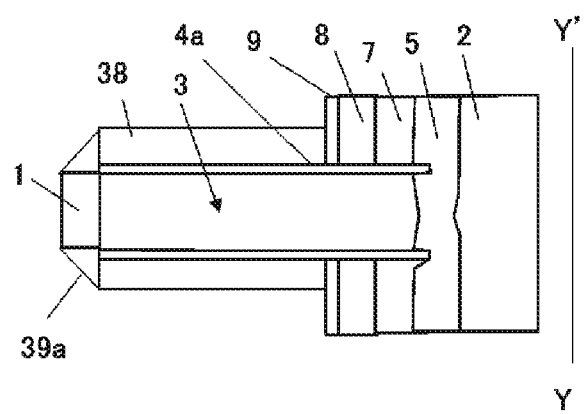
Figure 4A:
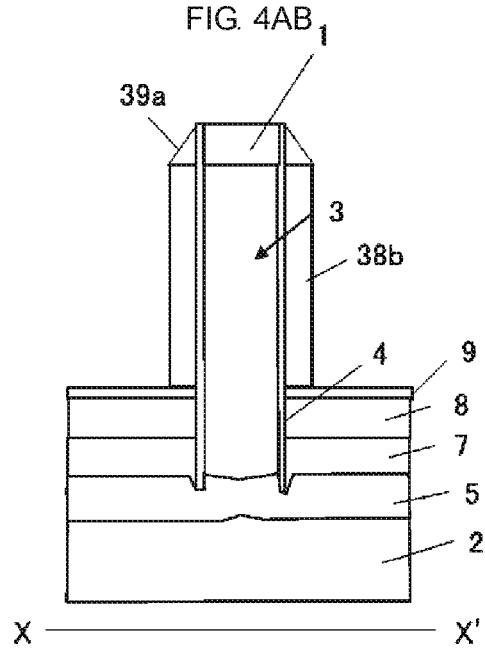

As illustrated in FIGS. 4AA to 4AC, without formation of the gate HfO$_2$ layer 11 and the gate TiN layer 12 in the steps illustrated in FIGS. 3AA to 3BC, the SiO$_2$ layer 38 is formed on an outer peripheral region around the SiO$_2$ layer/SiN layer 4 as in FIGS. 3AA to 3AC; and, similarly, a SiO$_2$ layer/SiN layer 39a is formed on the side surface of the mask material layer 1. Subsequently, the SiO$_2$ layer 38 is etched through, as masks, the SiO$_2$ layer/SiN layer 39a and the mask material layer 1 to form a SiO$_2$ layer 38b on the SiN layer 9 so as to surround the side surface of the SiO$_2$ layer/SiN layer 4.

Figure 4B:
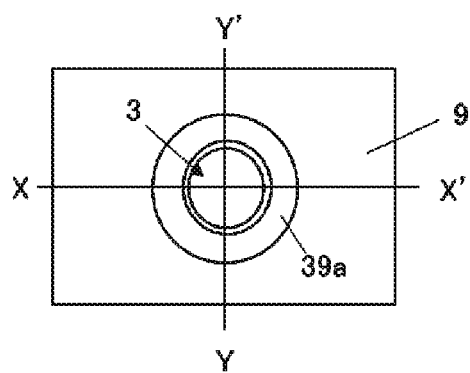
FIGS. 4BA to 4BC are a plan view and sectional structural views that illustrate a method for producing an SGT-including pillar-shaped semiconductor device according to a fourth embodiment of the present invention.
Figure 4B:
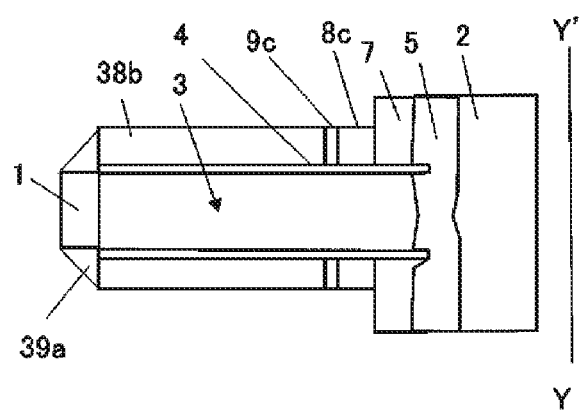
Figure 4B:
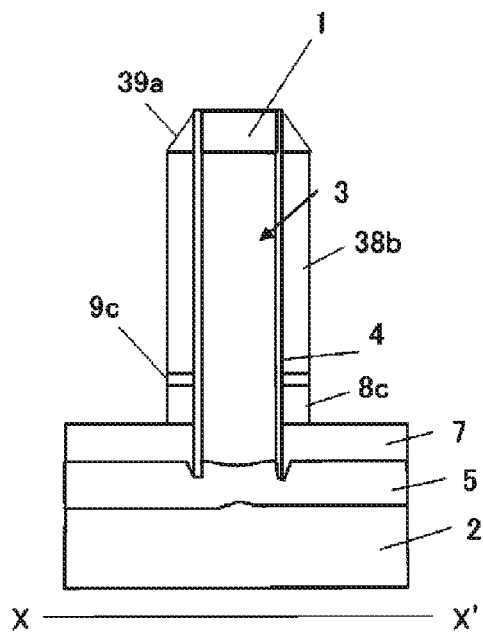

Subsequently, as illustrated in FIGS. 4BA to 4BC, the SiN layer 9 and the SiO$_2$ layer 8 are etched through, as masks, the SiO$_2$ layer/SiN layer 39a and the mask material layer 1, to form a SiN layer 9c and a SiO$_2$ layer 8c.

Subsequently, as illustrated in FIGS. 4CA to 4CC, the SiO$_2$ layer 8c is etched to expose the side surface of the bottom portion of the Si pillar 3. Subsequently, a selective epitaxial crystal growth method is performed to form a P$^+$ layer 50 containing an acceptor impurity at a high concentration. Subsequently, a W layer 51 is formed in contact with the P$^+$ layer and in an outer peripheral region around the P$^+$ layer. Subsequently, a SiN layer 52 is formed on the W layer 51 and in an outer peripheral region around the SiO$_2$ layer 38b.

Figure 4D:
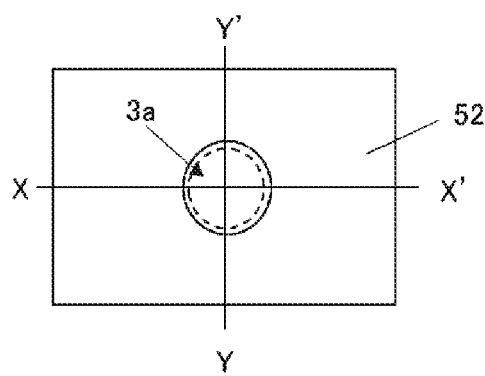
FIGS. 4DA to 4DC are a plan view and sectional structural views that illustrate a method for producing an SGT-including pillar-shaped semiconductor device according to a fourth embodiment of the present invention.
Figure 4D:
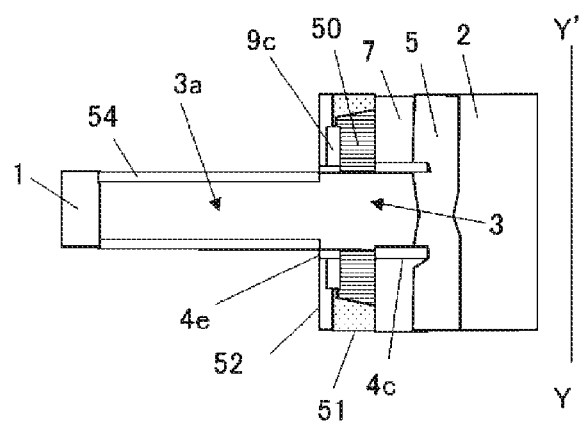
Figure 4D:
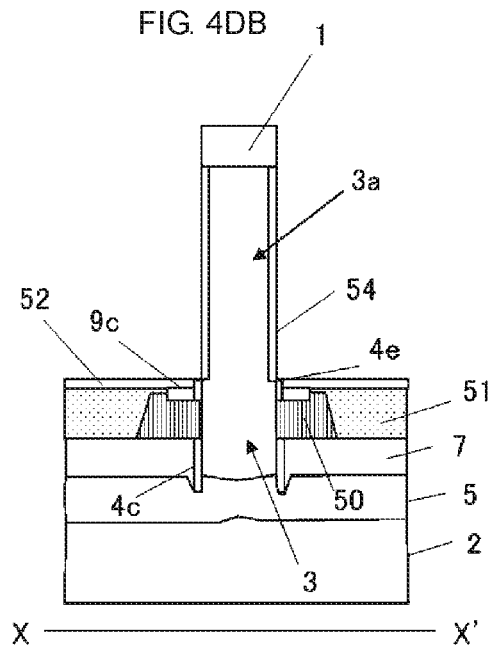

Subsequently, as illustrated in FIGS. 4DA to 4DC, the SiO$_2$ layer/SiN layer 39a, the SiO$_2$ layer 38b, and the SiN layer 4d are etched so as to leave a SiN layer 4e positioned in the bottom portion of the SiN layer 4d. Subsequently, the side surface of the Si pillar 3 is oxidized to form a SiO$_2$ layer 54. Subsequently, the SiO$_2$ layer 54 is removed. This forms a Si pillar 3a disposed, in the perpendicular direction, above the SiN layer 52, and having a smaller diameter than the Si pillar 3.

Figure 4E:
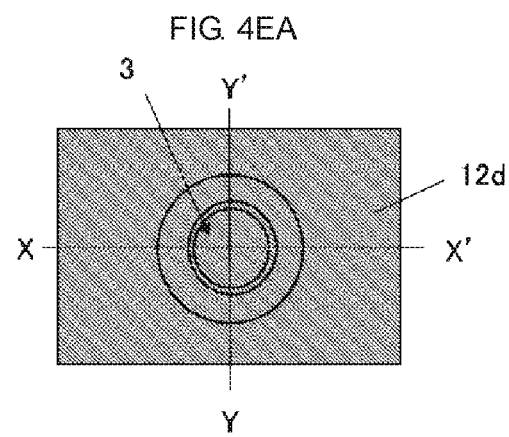
FIGS. 4EA to 4EC are a plan view and sectional structural views that illustrate a method for producing an SGT-including pillar-shaped semiconductor device according to a fourth embodiment of the present invention.
Figure 4E:
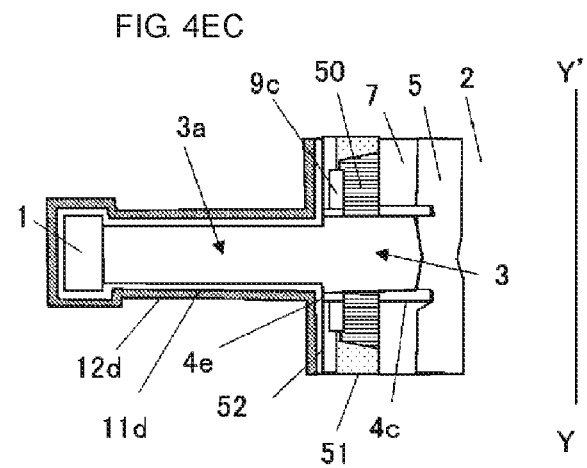
Figure 4E:
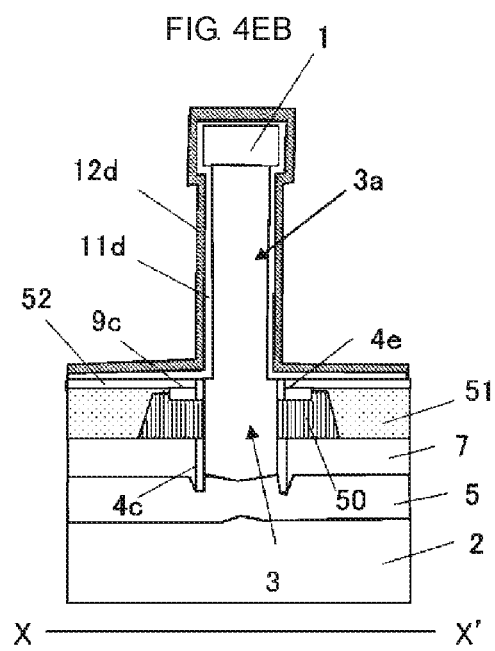
Figure 5:
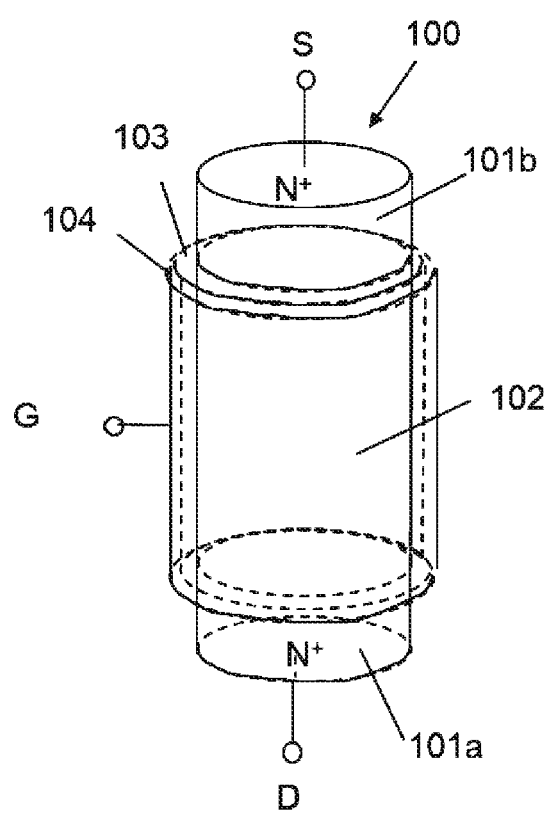
FIG. 5 is a schematic structural view of an existing SGT.

Subsequently, as illustrated in FIGS. 4EA to 4EC, a gate HfO$_2$ layer 11d and a gate TiN layer 12d are formed on the entire structure by an ALD method. Subsequently, the gate HfO$_2$ layer 11d and the gate TiN layer 12d are patterned by the same method as in FIGS. 1EA to 1EC and FIGS. 1FA to 1FC. Subsequently, the W layer 51 is patterned by the same method as in FIGS. 1IA to 1IC and FIGS. 1JA to 1JC. Subsequently, the steps as in FIG. 1KA to FIG. 1PC are performed to thereby form an SGT on the i-layer substrate 2.

The method for producing an SGT-including pillar-shaped semiconductor device according to this embodiment provides the following advantages.

1. In this embodiment, the P$^+$ layer 50 is formed, in plan view, in contact with the side surface of the Si pillar 3, which has a longer circumference than the Si pillar 3a. This provides an increased side surface area of the Si pillar 3 for flow of current flowing through the P$^+$ layer 50. This achieves a reduction in the source-or-drain resistance. Incidentally, in order to achieve a further reduction in the source-or-drain resistance, thermal steps performed by the final step more desirably cause the acceptor impurity from the P$^+$ layer 50 to diffuse to a region near the boundary between the upper Si pillar 3a and the bottom Si pillar 3.

2. In this embodiment, the P$^+$ layer 50 is formed prior to formation of the gate HfO$_2$ layer 11d and the gate TiN layer 12d. In this case, unlike the first embodiment, the selective epitaxial crystal growth of the P$^+$ layer 50 can be performed without considering thermal damage on the gate HfO$_2$ layer 11d, the gate TiN layer 12, and the gate HfO$_2$ layer 11d. This enables expansion of the process margin of the selective epitaxial crystal growth process for the P$^+$ layer 50, such as an increase in the epitaxial growth temperature for enhancing crystallinity.

Incidentally, embodiments according to the present invention have been described with examples of single-SGT transistors; however, the present invention is also applicable to formation of plural-SGT-including circuits.

Embodiments according to the present invention have been described with the case of formation of a single SGT in the single semiconductor pillar 3; however, the present invention is also applicable to formation of circuits in which two or more SGTs are formed in a single semiconductor pillar 3.

In the first embodiment, as illustrated in FIGS. 1AA to 1AC, the mask material layer 1 constituted by the $SiO_2$ layer/$Al_2O_3$ layer/$SiO_2$ layer is used as an etching mask. As long as the intended result is achieved, the material layer may be constituted by a single layer or another combination of plural layers. The same applies to other embodiments according to the present invention.

In the first embodiment, as illustrated in FIGS. 1AA to 1AC, the mask material layer 1 constituted by the $SiO_2$ layer/$Al_2O_3$ layer/$SiO_2$ layer is partially or entirely left, until the step illustrated in FIGS. 1LA to 1LC, as a mask for the top portion of the Si pillar 3 against the etching processes. As long as the intended result is achieved, the material layer may be constituted by a single layer or another combination of plural layers. The same applies to other embodiments according to the present invention.

In the first embodiment, as illustrated in FIGS. 1FA to 1FC, the mask material layer 1 and the SiN/$SiO_2$ layer 13 are used as masks for etching the TiN layer 12, the $HfO_2$ layer 11, the SiN layer 9, and the $SiO_2$ layer 8, to form the TiN layer 12a, the $HfO_2$ layer 11a, the SiN layer 9a, and the $SiO_2$ layer 8a. Instead of the SiN/$SiO_2$ layer 13, another material layer may be used that is constituted by a single layer or another combination of plural layers as long as it serves as the mask for etching the TiN layer 12, the $HfO_2$ layer 11, the SiN layer 9, and the $SiO_2$ layer 8. The same applies to the SiN/$SiO_2$ layer 25 in FIGS. 1KA to 1KC and, in the third embodiment, the SiN/$SiO_2$ layer 39 in FIGS. 3AA to 3AC. The same applies to other embodiments according to the present invention.

In the first embodiment, the Si pillar 3 is formed on the i-layer substrate 2, to form an SGT. Alternatively, the i-layer substrate 2 may be replaced by an SOI (Silicon on Insulator) substrate. The i-layer substrate 2 may have a well structure. The same applies to other embodiments according to the present invention.

In the first embodiment, as illustrated in FIGS. 1CA to 1CC, while the top portion of the Si pillar 3 is covered with the mask material layer 1 and the side surface of the Si pillar 3 is covered with the $SiO_2$/SiN layer 4, a thermal oxidation method is performed to form the $SiO_2$ layer 5 in the bottom portion of the Si pillar 3 and in the upper surface of the i-layer substrate 2. The $SiO_2$ layer 5 may be formed in the following manner: for example, an FCVD method and a CMP method are performed such that the entire structure is covered with an FCVD-$SiO_2$ layer and the level of the upper surface of the layer is lowered to the level of the upper surface of the mask material layer; and subsequently thermal oxidation is performed. In this case, oxygen (O) passes through the FCVD-$SiO_2$ layer, and oxidizes the bottom portion of the Si pillar 3 and the upper surface of the i-layer substrate 2, to thereby form the $SiO_2$ layer 5. Alternatively, another method may be performed to form the $SiO_2$ layer 5. The same applies to other embodiments according to the present invention.

In the first embodiment, as illustrated in FIGS. 1GA to 1GC, the exposed TiN layer 12a in the top portion and bottom portion of the TiN layer 12a is oxidized to form the TiNO layers 15a and 15b serving as insulating layers. Alternatively, for example, in FIGS. 1FA to 1FC, while the $SiO_2$ layer 8a is left, the exposed TiN layer 12a is etched to form recessed portions; subsequently, an ALD method is performed to fill the recessed portions and cover the entire structure with a SiN layer; while the SiN layers in the recessed portions are left, the other SiN layer covering the entire structure is etched off. As a result, insulating layers that are SiN layers can be formed in the top portion and the bottom portion of the TiN layer 12a. In this way, a method other than oxidation may be employed to form insulating layers in the top portion and bottom portion of the TiN layer 12a. The same applies to other embodiments according to the present invention.

In the first embodiment, as illustrated in FIGS. 1DA to 1DC, the SiN layer 7, the $SiO_2$ layer 8, and the SiN layer 9 are formed around the Si pillar 3 and on the $SiO_2$ layer 5. Subsequently, as illustrated in FIGS. 1FA to 1FC and FIGS. 1GA to 1GC, the mask material layer 1 and the SiN/$SiO_2$ layer 13 are used as masks for etching the TiN layer 12, the $HfO_2$ layer 11, the SiN layer 9, and the $SiO_2$ layer 8, to form the TiN layer 12a, the $HfO_2$ layer 11a, the SiN layer 9a, and the $SiO_2$ layer 8a. Subsequently, the exposed TiN layer 12a is oxidized, to form the TiNO layers 15a and 15b. Subsequently, the $SiO_2$ layer 8a is etched to form the space 16 through which the side surface of the bottom portion of the Si pillar 3 is exposed. In this case, the materials of the mask material layer 1, the SiN/$SiO_2$ layer 13, the TiN layer 12a, the $HfO_2$ layer 11a, the SiN layer 9, and the $SiO_2$ layer 8 and the etching methods for these layers may be freely selected as long as the side surface of the bottom portion of the Si pillar 3 is exposed. The same applies to other embodiments according to the present invention.

In the first embodiment, as illustrated in FIGS. 1HA to 1HC, the $P^+$ layer 18 is formed by a selective epitaxial crystal growth method. The $P^+$ layer 18 may be formed by, instead of a CVD method, for example, another method of achieving selective epitaxial crystal growth, such as molecular beam deposition, an ALD method, or a liquid phase epitaxial method. The same applies to formation of the $P^+$ layer 32. The same applies to other embodiments according to the present invention.

In the first embodiment, as illustrated in FIGS. 1JA to 1JC, the mask material layer 1, the SiN/$SiO_2$ layer 13, and the resist layer 22 are used as masks for etching of the $SiO_2$ layer 21 and the W layer 20. As a result, the W layer 20a is formed below the resist layer 22 and in contact with the $P^+$ layer 18, which has, in plan view, a ring shape surrounding the side surface of the Si pillar 3. The resist layer 22 may be constituted by, as long as the intended result of the etching is achieved, a resist material layer or a single layer or plural layers selected from organic layers and inorganic layers. The resist layer 22 may be etched in its upper layer portion during etching of the $SiO_2$ layer 21 and the W layer 20 as long as the resist layer 22 serves as a mask layer until the end of the etching. Alternatively, when the $SiO_2$ layer 21a serves as a mask during formation of the W layer 20a, the resist layer 22 may be removed at the final stage of etching. The same applies to the resist layer 27. The same applies to other embodiments according to the present invention.

In the first embodiment, as illustrated in FIGS. 1PA to 1PC, the level (in the perpendicular direction) of the lower end of the $P^+$ layer 32 is set at the level of the upper end of the TiN layer 12b serving as a gate conductor layer. This level of the bottom portion of the $P^+$ layer 32 is desirably located at the level of the upper end of the gate TiN layer 12b. This phrase "the level of the bottom portion of the $P^+$ layer 32 is located at the level of the upper end of the gate TiN layer 12b" encompasses cases where the level of the bottom portion of the $P^+$ layer 32 is located a little higher or a little lower than the level of the upper end of the gate TiN layer 12b as long as the operation of the SGT is not adversely affected. The level (in the perpendicular direction)

of the lower end of the P+ layer 32 may be higher or lower than the level of the upper end of the gate insulating layer 11b. The same applies to other embodiments according to the present invention.

In the first embodiment, the wiring conductor layer portion connected to the P+ layer 18 is formed as the W layer 20a; alternatively, the portion may be formed as another material layer constituted by a single layer or plural layers, such as metal or alloy layers. The same applies to, in the third embodiment, the Ta layer 46 connected to the P+ layer 43. The same applies to other embodiments according to the present invention.

The embodiments according to the present invention have been described with the Si pillars 3 having a circular shape in plan view. However, the present invention is similarly applicable to cases where the Si pillar 3 has a rectangular shape or an elliptical shape in plan view.

In the first embodiment, as illustrated in FIGS. 1PA to 1PC, the P+ layers 18 and 32 are formed on the side surface of the bottom portion of and on the top portion of the Si pillar 3. Observation of magnified views of the boundaries between the Si pillar 3 and the P+ layers 18 and 32 reveals that the acceptor impurity in the P+ layers 18 and 32 is diffused by a post-formation heating step into the Si pillar 3. In this case, compared with ion implantation and a solid-phase diffusion method, the sharp-change distributions of the acceptor impurity are maintained at the boundaries between the Si pillar 3 and the P+ layers 18 and 32, which enables a reduction in the junction resistance. With a further decrease in the diameter of the Si pillar 3 in plan view, the acceptor impurity from the P+ layers 18 and 32 formed by a selective epitaxial crystal growth method is diffused throughout the Si pillar 3 in plan view. Even in this case, the impurity distribution in the perpendicular direction within the Si pillar 3 changes sharply, compared with ion implantation and a solid-phase diffusion method. This is because, in the first embodiment, the P+ layer 18 is first formed in the outer peripheral region around the Si pillar 3; by contrast, the ion implantation requires an impurity-ion activation treatment at a high temperature, and the solid-phase diffusion method requires a heat treatment for thermally diffusing impurity for the purpose of forming a P+ region within the Si pillar 3. Incidentally, in order to provide the sharp change of the impurity distribution, thermal steps after formation of the P+ layers 18 and 32 are desirably performed at lower temperatures and for shorter times. The same applies to other embodiments according to the present invention.

Similarly, in the first embodiment, with a further decrease in the diameter of the Si pillar 3 in plan view, the acceptor impurity from the P+ layer 18 formed by a selective epitaxial crystal growth method diffuses throughout the Si pillar 3 in plan view. In this case, the level (in the perpendicular direction) of the upper end of the P+ layer 18 within the Si pillar 3 is located higher than the level of the lower end of the SiN layer 9a. The level of the upper end of the P+ layer 18 within the Si pillar 3 is desirably located at the level of the lower end of the gate TiN layer 12b. However, as long as the operation of the SGT is not adversely affected, the level of the upper end of the P+ layer 18 within the Si pillar 3 may be located higher or lower than the level of the lower end of the gate TiN layer 12b. The same applies to the P+ layer 32. The same applies to other embodiments according to the present invention.

As described in the fourth embodiment, thermal steps performed by the final step more desirably cause the acceptor impurity from the P+ layer 50 to diffuse to a region near the boundary between the upper Si pillar 3a and the bottom Si pillar 3. Even in this case, as long as the operation of the SGT is not adversely affected, an acceptor impurity diffusion region connected to the P+ layer 50 may have an upper end located at the level of the upper end of the bottom Si pillar 3. This phrase "located at the level of the upper end of the bottom Si pillar 3" encompasses cases where the level of the upper end of the acceptor impurity diffusion region is located a little higher or a little lower than the boundary between the upper Si pillar 3a and the bottom Si pillar 3.

In the first embodiment, the P+ layers 18 and 32 containing an acceptor impurity at a high concentration are formed on the side surface of the bottom portion of and on the top portion of the Si pillar 3. Alternatively, the P+ layers 18 and 32 may be replaced by N+ layers. Alternatively, a plurality of semiconductor pillars may be formed on a substrate, and may be individually provided with P+ layers 18 and 32 or N+ layers formed of different semiconductor materials. Alternatively, the Si pillar 3 may be replaced by a pillar of another semiconductor material. The same applies to other embodiments according to the present invention.

In the first embodiment, the P+ layers 18 and 32 are each formed by the selective epitaxial crystal growth method so as to contain the acceptor impurity at a high concentration. This enables formation of PN junctions where the acceptor impurity concentration sharply changes at the junction interface between the Si pillar 3 and the P+ layer 18 or 32. This leads to a decrease in the resistance of the source and drain of the SGT. Such a decrease in the resistance of the source or drain is achieved even in the case of forming one of the P+ layer 18 and the P+ layer 32 so as to contain an acceptor impurity at a high concentration by selective epitaxial crystal growth.

The first embodiment has been described with a case where the gate electrode is the TiN layer 12b. Alternatively, the gate electrode material layer may be another conductor layer constituted by a single layer or plural layers. The same applies to other embodiments according to the present invention.

The first embodiment has been described with an SGT in which the P+ layers 18 and 32, which are located on the top of and at the bottom of the Si pillar 3 and have a conductivity of the same polarity, constitute the source and the drain. Alternatively, the present invention is also applicable to a tunnel SGT having a source and a drain having different polarities. The same applies to other embodiments (except for the third embodiment) according to the present invention.

In the first embodiment, the P+ layer 18 is formed so as to be above and separated (in the perpendicular direction) from the upper end of the SiO$_2$ layer 5. This enables prevention of overlapping (in the perpendicular direction) of the SiO$_2$ layer 5 and the P+ layer 18. This enables prevention of an increase in the resistance of the source or drain caused by overlapping of the SiO$_2$ layer 5 and the P+ layer 18 and by the resultant decrease in the contact area between the P+ layer 18 and the Si surface of the side surface of the Si pillar 3. In addition, the side surface of the bottom portion of the Si pillar 3 on which the P+ layer 18 is grown by selective epitaxial crystal growth can be separated from the interface (where stress concentration occurs) between the Si pillar 3 and the SiO$_2$ layer 5. This enables formation of the P+ layer 18 of high crystallinity on the side surface of the bottom portion of the Si pillar 3 by selective epitaxial crystal growth. The same applies to other embodiments according to the present invention.

In the first embodiment, as has been described with FIGS. 1NA to 1NC and FIGS. 10A to 10C, the top portion of the Si pillar 3 is etched to form the recessed portion 31, and subsequently the P$^+$ layer 32 is formed in the recessed portion 31 by a selective epitaxial crystal growth method. Alternatively, for example, as has been described with FIGS. 1MA to 1MC, a SiN layer (not shown) is formed so as to cover the entire structure; subsequently, a CMP process is performed to polish the SiN layer such that the level of the upper surface is lowered to the level of the upper surface of the mask material layer 1. Subsequently, the mask material layer 1 is etched to the Al$_2$O$_3$ layer. Alternatively, the whole mask material layer 1 may be etched to form, above the Si pillar 3, a recessed portion similar to the recessed portion 31. The same applies to other embodiments according to the present invention.

As described in the second embodiment, prior to formation of the W layer 36, a barrier metal layer for decreasing the resistance between the P$^+$ layer 35 and the W layer 36, such as a Ta layer, may be formed between the P$^+$ layer 35 and the W layer 36. In this case, in plan view, the Ta layer is formed so as to surround, with a constant width, the P$^+$ layer 35. This Ta layer may be constituted by a conductor layer having a constant width in plan view and constituted by a single layer or plural layers. The same applies to other embodiments according to the present invention.

In the third embodiment, after the mask material layer 1 is removed, the top portion of the Si pillar 3 is etched to form the recessed portion 42. This recessed portion 42 can be formed, as in the first embodiment, only by removing the mask material layer 1. In this case, desirably, the top portion of the Si pillar 3 is slightly oxidized, and cleaning is performed to remove the resultant oxide film. The same applies to other embodiments according to the present invention.

In the third embodiment, the SiO$_2$ layer 38a in FIGS. 3EA to 3EC is not limited to a SiO$_2$ layer and may be another material layer as long as a Si layer does not deposit on the outer surface layer of the material layer during selective epitaxial crystal growth of the P$^+$ layers 43 and 44. This material layer may be constituted by a single layer or plural layers. The same applies to other embodiments according to the present invention.

In the fourth embodiment, the P$^+$ layer 50 is formed prior to formation of the gate HfO$_2$ layer 11d and the gate TiN layer 12d. The same applies to other embodiments according to the present invention.

In the fourth embodiment, as illustrated in FIGS. 4DA to 4DC, the exposed side surface of the Si pillar 3 is oxidized to form the SiO$_2$ layer 54. This SiO$_2$ layer 54 is removed, to form the Si pillar 3a, which is narrower than, in plan view, the Si pillar 3. Alternatively, another method such as etching of the Si layer in the exposed surface of the Si pillar 3 may be employed to form the Si pillar 3a. The same applies to other embodiments according to the present invention.

The above embodiments describe examples in which semiconductor regions of the semiconductor pillars such as channels, sources, and drains are formed of Si (silicon). However, this does not limit the present invention. The technical idea of the present invention is also applicable to SGT-including semiconductor devices that employ Si-containing semiconductor materials such as SiGe, or semiconductor materials other than Si.

The vertical NAND-type flash memory circuit includes plural memory cells stacked in the vertical direction, the memory cells each including a semiconductor pillar as the channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits. The present invention is also applicable to transistors in logic circuit regions other than memory regions. Similarly, the present invention is also applicable to memory regions such as MRAM (Magnetoresistive Random Access Memory) and/or logic circuit regions.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the spirit and scope of the present invention.

Methods for producing pillar-shaped semiconductor devices according to the present invention provide high-performance pillar-shaped semiconductor devices.

What is claimed is:

1. A method for producing a pillar-shaped semiconductor device, the method comprising:
   forming a semiconductor pillar so as to stand vertically from a substrate;
   forming a gate insulating layer so as to surround a side surface of the semiconductor pillar;
   forming a gate conductor layer so as to surround a side surface of the gate insulating layer;
   forming a first impurity region below the gate insulating layer in contact with a lower portion or the side surface of the semiconductor pillar, wherein the first impurity region contains a donor or acceptor impurity; and
   forming a second impurity region above the gate insulating layer on a top portion of the semiconductor pillar, wherein the second impurity region contains a donor or acceptor impurity,
   wherein the step of forming the second impurity region comprises forming a first material layer around the top portion of the semiconductor pillar, and etching the top portion of the semiconductor pillar using the first material layer as a mask to form a recessed portion above the etched semiconductor pillar,
   the method further comprising:
   forming a second material layer around the side surface of the semiconductor pillar below the gate insulating layer; etching the second material layer to form an opening portion around the side surface of the semiconductor pillar below the gate insulating layer; and simultaneously forming the second impurity region in the recessed portion and the first impurity region in the opening portion, using a selective epitaxial crystal growth method.

2. The method for producing a pillar-shaped semiconductor device according to claim 1, wherein the second impurity region is formed so as to have an upper end located higher than the recessed portion.

3. The method for producing a pillar-shaped semiconductor device according to claim 1, the method further comprising forming a first conductor layer within the recessed portion in contact with a top of the second impurity region.

4. The method for producing a pillar-shaped semiconductor device according to claim 1, wherein the step of forming the semiconductor pillar comprises etching a semiconductor layer formed on the substrate using, as a mask, a mask material layer formed on the semiconductor layer, and
the step of forming the first impurity region comprises forming a third material layer around the side surface of the semiconductor pillar,
the method further comprising performing oxidation, using the mask material layer and the third material layer as anti-oxidation masks, to form an oxidized layer in an upper portion of the semiconductor layer around a bottom portion of the semiconductor pillar.

5. The method for producing a pillar-shaped semiconductor device according to claim 4, wherein the first impurity region is formed so that a bottom of the first impurity region is located apart from a top of the oxidized layer.

6. The method for producing a pillar-shaped semiconductor device according to claim 1, the method further comprising:
forming a fourth material layer around a bottom portion of the semiconductor pillar;
forming a fifth material layer on the fourth material layer around the semiconductor pillar with a constant horizontal width, wherein the fifth material later is constituted by a single layer or a plurality of vertically formed layers;
vertically etching the fourth material layer using the fifth material layer as a mask;
horizontally etching the fourth material layer, using the fifth material layer as a mask, to form the opening portion through which a side surface of a lower portion of the semiconductor pillar is exposed; and
forming the first impurity region on by a selective epitaxial crystal growth method so that the first impurity region horizontally extends from the side surface of the semiconductor pillar out of the opening portion.

7. The method for producing a pillar-shaped semiconductor device according to claim 1, wherein the first impurity region is formed before the gate insulating layer is formed.

8. The method for producing a pillar-shaped semiconductor device according to claim 7, the method further comprising:
after forming the first impurity region, removing an outer periphery of the semiconductor pillar with a constant horizontal width above a top of the first impurity region; and
forming the gate insulating layer after removing the outer periphery of the semiconductor pillar.

9. The method for producing a pillar-shaped semiconductor device according to claim 1, the method further comprising, after forming the first impurity region and the second impurity region, performing a heat treatment to diffuse the donor or acceptor impurity contained in the first impurity region into the semiconductor pillar to form a third impurity region and simultaneously diffuse the donor or acceptor impurity contained in the second impurity region into the semiconductor pillar to form a fourth impurity region.

10. A method for producing a pillar-shaped semiconductor device, the method further comprising:
forming a semiconductor pillar so as to stand vertically from a substrate;
forming a gate insulating layer around a side surface of the semiconductor pillar;
forming a gate conductor layer around a side surface of the gate insulating layer;
forming a first impurity region below the gate insulating layer in contact with a lower portion or the side surface of the semiconductor pillar, wherein the first impurity region contains a donor or acceptor impurity; and
forming a second impurity region above the gate insulating layer on a top portion of the semiconductor pillar, wherein the second impurity region contains a donor or acceptor impurity,
wherein the step of forming the first impurity region comprises:
forming a first material layer around a bottom portion of the semiconductor pillar;
forming a second material layer on the first material layer around the semiconductor pillar with a constant horizontal width, wherein the second material layer is constituted by a single layer or a plurality of vertically formed layers;
vertically etching the first material layer, using the second material layer as a mask, to form an opening portion through which a side surface of a lower portion of the semiconductor pillar is exposed; and
forming the first impurity region by a selective epitaxial crystal growth method so that the first impurity region horizontally extends from the side surface of the semiconductor pillar out of the opening portion.

11. The method for producing a pillar-shaped semiconductor device according to claim 10, wherein
the step of forming the semiconductor pillar comprises etching a semiconductor layer formed on the substrate using, as a mask, a mask material layer formed on the semiconductor layer, and
the step of forming the first impurity region comprises forming a third material layer around the side surface of the semiconductor pillar,
the method further comprising performing oxidation, using the mask material layer and the third material layer as anti-oxidation masks, to form an oxidized layer in an upper portion of the semiconductor layer around a bottom portion of the semiconductor pillar.

12. The method for producing a pillar-shaped semiconductor device according to claim 10, wherein the first impurity region is formed so that a bottom of the first impurity region is located apart from a top of the oxidized layer.

13. The method for producing a pillar-shaped semiconductor device according to claim 10, wherein the first impurity region is formed before the gate insulating layer is formed.

14. The method for producing a pillar-shaped semiconductor device according to claim 10, the method further comprising:
after forming the first impurity region, removing an outer periphery of the semiconductor pillar with a constant horizontal width above a top of the first impurity region; and
after the step of removing the outer periphery of the semiconductor pillar, forming the gate insulating layer.

15. The method for producing a pillar-shaped semiconductor device according to claim 14, the method further comprising:
after forming the first impurity region, performing a heat treatment to diffuse the donor or acceptor impurity contained in the first impurity region into the semiconductor pillar to form a third impurity region so that a top of the third impurity region as high as as a lower end of the outer periphery of the semiconductor pillar which is removed by the step o removing.

16. The method for producing a pillar-shaped semiconductor device according to claim 10, wherein the second material layer comprises the gate insulating layer, the gate conductor layer, and a fourth material layer surrounding a side surface of the gate conductor layer.

17. The method for producing a pillar-shaped semiconductor device according to claim 10, the method further comprising vertically forming a first insulating layer between the gate conductor layer and the first impurity region.

18. A method for producing a pillar-shaped semiconductor device, the method comprising:
    forming a semiconductor pillar so as to stand vertically from a substrate;
    forming a gate insulating layer so as to surround a side surface of the semiconductor pillar;
    forming a gate conductor layer so as to surround a side surface of the gate insulating layer;
    forming a first impurity region below the gate insulating layer in contact with a lower portion or the side surface of the semiconductor pillar, wherein the first impurity region contains a donor or acceptor impurity; and
    forming a second impurity region above the gate insulating layer on a top portion of the semiconductor pillar, wherein the second impurity region contains a donor or acceptor impurity,
    wherein the step of forming the semiconductor pillar comprises etching a semiconductor layer formed on the substrate using, as a mask, a mask material layer formed on the semiconductor layer,
    the step of forming the first impurity region comprises forming a third material layer around the side surface of the semiconductor pillar, and
    the step of forming the second impurity region comprises forming a first material layer around the top portion of the semiconductor pillar and etching the top portion of the semiconductor pillar using the first material layer as a mask to form a recessed portion above the etched semiconductor pillar; and
    the method further comprising:
    forming a second material layer around the side surface of the semiconductor pillar below the gate insulating layer;
    etching the second material layer to form an opening portion around the side surface of the semiconductor pillar below the gate insulating layer;
    simultaneously forming the second impurity region in the recessed portion and the first impurity region in the opening portion, using a selective epitaxial crystal growth method; and
    performing oxidation, using the mask material layer and the third material layer as anti-oxidation masks, to form an oxidized layer in an upper portion of the semiconductor layer around a bottom portion of the semiconductor pillar.

19. A method for producing a pillar-shaped semiconductor device, the method further comprising:
    forming a semiconductor pillar so as to stand vertically from a substrate;
    forming a gate insulating layer around a side surface of the semiconductor pillar;
    forming a gate conductor layer around a side surface of the gate insulating layer;
    forming a first impurity region below the gate insulating layer in contact with a lower portion or the side surface of the semiconductor pillar, wherein the first impurity region contains a donor or acceptor impurity; and
    forming a second impurity region above the gate insulating layer on a top portion of the semiconductor pillar, wherein the second impurity region contains a donor or acceptor impurity,
    wherein the step of forming the first impurity region comprises:
    forming a first material layer around a bottom portion of the semiconductor pillar;
    forming a second material layer on the first material layer around the semiconductor pillar with a constant horizontal width, wherein the second material layer is constituted by a single layer or a plurality of vertically formed layers;
    vertically etching the first material layer, using the second material layer as a mask, to form an opening portion through which a side surface of a lower portion of the semiconductor pillar is exposed; and
    forming the first impurity region by a selective epitaxial crystal growth method so that the first impurity region horizontally extends from the side surface of the semiconductor pillar out of the opening portion,
    wherein the step of forming the semiconductor pillar comprises etching a semiconductor layer formed on the substrate using, as a mask, a mask material layer formed on the semiconductor layer,
    the step of forming the first impurity region comprises forming a third material layer around the side surface of the semiconductor pillar, and
    the method further comprising performing oxidation, using the mask material layer and the third material layer as anti-oxidation masks, to form an oxidized layer in an upper portion of the semiconductor layer around a bottom portion of the semiconductor pillar.

* * * * *

UNITED STATES PATENT AND TRADEMARK OFFICE
CERTIFICATE OF CORRECTION

PATENT NO. : 11,380,780 B2
APPLICATION NO. : 16/992352
DATED : July 5, 2022
INVENTOR(S) : Fujio Masuoka et al.

It is certified that error appears in the above-identified patent and that said Letters Patent is hereby corrected as shown below:

In the Claims

Column 21, Claim 6, Line 27, delete "later" and replace with --layer--.

Column 21, Claim 6, Line 36, delete "on".

Column 23, Claim 15, Line 1, insert --is-- between "region" and "as".

Column 23, Claim 15, Line 1, delete 3rd instance of "as".

Signed and Sealed this
Eighth Day of November, 2022

Katherine Kelly Vidal
*Director of the United States Patent and Trademark Office*